US011307052B2

(12) United States Patent
Saruki et al.

(10) Patent No.: US 11,307,052 B2
(45) Date of Patent: Apr. 19, 2022

(54) SIGNAL PROCESSING CIRCUIT, POSITION DETECTION DEVICE, AND MAGNETIC SENSOR SYSTEM

(71) Applicant: TDK CORPORATION, Tokyo (JP)

(72) Inventors: Shunji Saruki, Tokyo (JP); Shinichirou Mochizuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 154 days.

(21) Appl. No.: 16/743,126

(22) Filed: Jan. 15, 2020

(65) Prior Publication Data
US 2020/0300665 A1 Sep. 24, 2020

(30) Foreign Application Priority Data

Mar. 18, 2019 (JP) .............................. JP2019-049336

(51) Int. Cl.
*G01D 5/14* (2006.01)
*G01B 7/00* (2006.01)
(Continued)

(52) U.S. Cl.
CPC ............. *G01D 5/145* (2013.01); *G01B 7/003* (2013.01); *G01D 5/2448* (2013.01);
(Continued)

(58) Field of Classification Search
CPC ................................. G01D 5/145; G01B 7/003
See application file for complete search history.

(56) References Cited

U.S. PATENT DOCUMENTS 4,500,867 A * 2/1985 Ishitobi ................. G01D 5/145
200/6 A
8,089,459 B2 * 1/2012 Passaro ................ G06F 3/0338
345/161
(Continued)

FOREIGN PATENT DOCUMENTS

JP       H04-285805 A      10/1992
JP       2011-185862 A      9/2011
(Continued)

OTHER PUBLICATIONS

Feb. 24, 2021 Office Action issued in Japanese Patent Application No. 2019-049336.

*Primary Examiner* — Reena Aurora
(74) *Attorney, Agent, or Firm* — Oliff PLC

(57) ABSTRACT

A magnetic sensor system includes a magnetic device and a signal processing circuit. The device generates first to third detection signals corresponding to components in three directions of a magnetic field generated by a magnetic field generator that is able to change its relative position with respect to the device. The circuit includes a longest segment extraction section and a midpoint coordinate computing section. With coordinates that represent a set of values of the first to third detection signals at a certain timing in an orthogonal coordinate system being taken as a measurement point, the longest segment extraction section extracts a first point and a second point that define a line segment having the greatest length among a plurality of measurement points at a plurality of timings. The midpoint coordinate computing section determines coordinates of a midpoint of the line segment defined by the first and second points.

12 Claims, 20 Drawing Sheets

(51) Int. Cl.
  *G01D 5/244*   (2006.01)
  *G01R 33/09*   (2006.01)
  *G01R 33/00*   (2006.01)

(52) U.S. Cl.
  CPC ..... *G01D 5/24485* (2013.01); *G01R 33/0029* (2013.01); *G01R 33/091* (2013.01)

(56) References Cited

U.S. PATENT DOCUMENTS

| | | |
|---|---|---|
| 9,605,978 B2* | 3/2017 | Ausserlechner ....... G01D 5/145 |
| 2008/0116886 A1 | 5/2008 | Yamada et al. |
| 2009/0212766 A1 | 8/2009 | Olson et al. |
| 2014/0257731 A1 | 9/2014 | Konda et al. |
| 2016/0084938 A1 | 3/2016 | Doi et al. |
| 2018/0087927 A1 | 3/2018 | Anagawa et al. |
| 2018/0106903 A1 | 4/2018 | Iida et al. |
| 2018/0164127 A1 | 6/2018 | Anagawa et al. |

FOREIGN PATENT DOCUMENTS

| | | |
|---|---|---|
| JP | 2018-189512 A | 11/2018 |
| WO | 2013/125242 A1 | 8/2013 |

\* cited by examiner

SIGNAL PROCESSING CIRCUIT, POSITION DETECTION DEVICE, AND MAGNETIC SENSOR SYSTEM

BACKGROUND OF THE INVENTION

1. Field of the Invention

The present invention relates to a signal processing circuit for processing three detection signals, the three detection signals being output from a magnetic sensor device and having correspondences with components in three mutually different directions of a magnetic field applied to the magnetic sensor device, and to a position detection device and a magnetic sensor system each including the signal processing circuit.

2. Description of the Related Art

A magnetic sensor device for detecting components in a plurality of directions of an applied magnetic field has recently been used in a variety of applications. An example of the applications of such a magnetic sensor device is a magnetic position detection device for detecting the position of a three-dimensionally movable magnet, as disclosed in, for example, US2009/0212766A1 and JP2018-189512A.

The magnetic position detection device includes, for example, a magnetic sensor device, a magnet movable along a predetermined spherical surface around the magnetic sensor device, and a signal processing circuit. The magnetic sensor device detects three components in three mutually orthogonal directions of a magnetic field generated by the magnet and applied to the magnetic sensor device, and generates three detection signals corresponding to the three components. Based on the three detection signals, the signal processing circuit generates position information indicating the position of the magnet.

Such a magnetic position detection device can cause offsets in the three detection signals and consequently produce inaccurate position information if a disturbance magnetic field other than the magnetic field generated by the magnet is applied to the magnetic sensor device or the positional relationship between the magnetic sensor device and the magnet deviates from a desired one.

Methods for correcting offsets occurring in the three detection signals are known in the art. A typical one of the methods is as follows. Taking coordinates that represent a set of values of the three detection signals at a certain timing in a three-dimensional orthogonal coordinate system as a measurement point, a virtual sphere having a spherical surface approximating the distribution of a plurality of measurement points at a plurality of timings is determined and the center coordinates of the virtual sphere are used to correct the offsets.

JP2011-185862A describes a technique for determining the center coordinates of a new virtual sphere in response to changes in the offsets. JP2011-185862A describes a magnetic field detector including a magnetic detection section and a computing section. The magnetic detection section includes an X-axis sensor, a Y-axis sensor, and a Z-axis sensor. Based on detection outputs of the X-, Y-, and Z-axis sensors, the computing section determines a magnetic vector as a coordinate point on spherical coordinates having a center point on three-dimensional coordinates. If a predetermined number or more of shift coordinate points off the initially-set spherical coordinates are detected, the computing section determines the center point of new spherical coordinates by using the plurality of shift coordinate points. The center point of the spherical coordinates serves as a reference point of origin in expressing a magnetic vector as a coordinate point on the spherical coordinates. The spherical coordinates according to JP2011-185862A correspond to the foregoing virtual sphere. The center point of the spherical coordinates according to JP2011-185862A corresponds to the center coordinates of the foregoing virtual sphere.

JP2011-185862A describes the following first and second methods as methods for determining the center point of new spherical coordinates. In the first method, with the radius of initial spherical coordinates as R, a virtual sphere having the radius R around a shift coordinate point and a virtual sphere having the radius R around another shift coordinate point are determined. Further, an intersecting circle between the two virtual spheres is determined, and a point closest to the center point of the initially-set spherical coordinates on the intersecting circle is determined as the center point of the new spherical coordinates. In the second method, a plane that passes through the midpoint of a line segment connecting two shift coordinate points and is orthogonal to the line segment is determined. Further, an intersection point of the plane and a normal drawn to the plane from the center point of the initially-set spherical coordinates is determined. Then, a point that lies on a line connecting the intersection point and the midpoint and away from the midpoint by the radius R is determined as the center point of the new spherical coordinates.

In the foregoing magnetic position detection device including the magnetic sensor device, the magnet and the signal processing circuit, the offsets of the three detection signals can change due to some factor such as a change in the environment, and as a result, the center coordinates of the foregoing virtual sphere can change. Corrections become inaccurate if the center coordinates used in the processing for correcting the offsets are not updated upon change of the center coordinates. The position detection device is therefore desirably capable of quickly identifying a change in the offsets. For that purpose, the position detection device is desirably capable of quickly estimating the center coordinates of the virtual sphere after a change in the offsets.

The center point of the new spherical coordinates described in JP2011-185862A corresponds to the foregoing center coordinates of the virtual sphere after a change in the offsets. As mentioned above, JP2011-185862A describes the first and second methods for determining the center point of new spherical coordinates. In the first method, two virtual spheres need to be determined. In the second method, the equation of the plane needs to be determined. Both the first and second methods need relatively complicated computations and a considerable amount of time. Disadvantageously, it is thus difficult with the first and second methods described in JP2011-185862A to quickly estimate center coordinates of the virtual sphere after a change in the offsets.

SUMMARY OF THE INVENTION

It is an object of the present invention to provide a signal processing circuit, a position detection device and a magnetic sensor system that are capable of, if offsets of three detection signals having correspondences with components in three mutually different directions of a magnetic field detected by a magnetic sensor device have changed, quickly estimating center coordinates of a virtual sphere after the change in the offsets.

A signal processing circuit of the present invention is a circuit for processing a first detection signal, a second detection signal and a third detection signal that have correspondences with components in three mutually different directions of a magnetic field at a reference position. The first to third detection signals are output from a magnetic sensor device that generates the first to third detection signals.

The signal processing circuit of the present invention performs first processing and second processing. The first processing includes, with coordinates that represent a set of values of the first to third detection signals at a certain timing in an orthogonal coordinate system defined by three axes for expressing the values of the first to third detection signals being taken as a measurement point, extracting a first point and a second point that define a line segment having the greatest length among a plurality of measurement points at a plurality of timings. The second processing includes determining coordinates of a midpoint of the line segment defined by the first and second points extracted by the first processing.

The second processing may further include determining one half of the length of the line segment defined by the first and second points as magnetic field strength data, and storing the coordinates of the midpoint and the magnetic field strength data. In such a case, the signal processing circuit may further perform offset change detection processing for detecting a change in offsets of the first to third detection signals by using the coordinates of the midpoint and the magnetic field strength data stored by the second processing.

The signal processing circuit of the present invention may further perform sphere information generation processing for generating sphere information by computation using the first to third detection signals. The sphere information may include data on center coordinates and a radius of a virtual sphere having a spherical surface approximating a distribution of the plurality of measurement points at the plurality of timings.

The signal processing circuit of the present invention may further perform offset correction processing. The offset correction processing may include correcting the offsets of the first to third detection signals to generate first to third corrected signals by using the data on the center coordinates included in the sphere information generated by the sphere information generation processing.

The signal processing circuit of the present invention may further perform offset change detection processing for detecting a change in the offsets of the first to third detection signals. The offset change detection processing may include starting the sphere information generation processing upon detection of a change in the offsets. In such a case, the second processing may further include determining one half of the length of the line segment defined by the first and second points as magnetic field strength data, and storing the coordinates of the midpoint and the magnetic field strength data. The offset change detection processing may be performed by using either a set of the coordinates of the midpoint and the magnetic field strength data stored by the second processing or the sphere information generated by the sphere information generation processing.

If new sphere information is obtained within a predetermined time after the sphere information generation processing is started, the offset change detection processing may be performed by using the new sphere information. If no new sphere information is obtained within the predetermined time after the sphere information generation processing is started, the offset change detection processing may be performed by using the set of the coordinates of the midpoint and the magnetic field strength data.

A position detection device of the present invention includes a magnetic field generator that generates a predetermined magnetic field, a magnetic sensor device, and the signal processing circuit of the present invention. The magnetic field generator is able to change its relative position with respect to the magnetic sensor device along a predetermined spherical surface. The magnetic sensor device generates the first to third detection signals.

A magnetic sensor system of the present invention includes a magnetic sensor device, and the signal processing circuit of the present invention. The magnetic sensor device includes a first magnetic sensor for generating the first detection signal, a second magnetic sensor for generating the second detection signal, and a third magnetic sensor for generating the third detection signal.

According to the signal processing circuit, the position detection device and the magnetic sensor system of the present invention, coordinates of the midpoint of the line segment defined by the first and second points are determined by the first and second processing, which are relatively simple processing. The coordinates of the midpoint correspond to estimated center coordinates of the virtual sphere. The present invention thus makes it possible that the center coordinates of the virtual sphere after a change in the offsets of the first to third detection signals are quickly estimated if the offsets have changed.

Other and further objects, features and advantages of the present invention will appear more fully from the following description.

DETAILED DESCRIPTION OF THE PREFERRED EMBODIMENTS

First Embodiment

Figure 1:
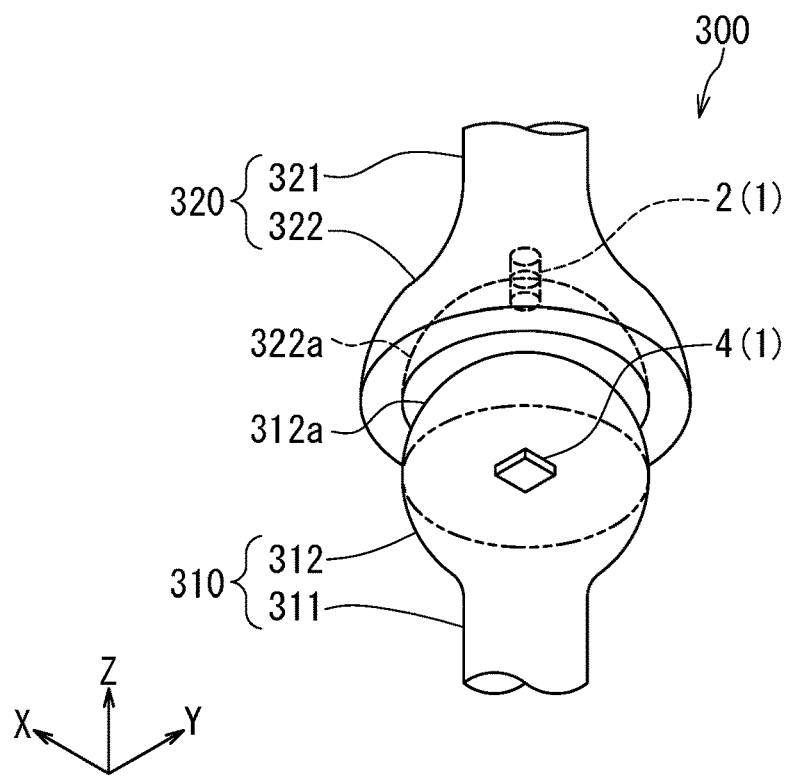
FIG. 1 is a perspective view illustrating a schematic configuration of a joint mechanism including a position detection device according to a first embodiment of the invention.
Figure 2:
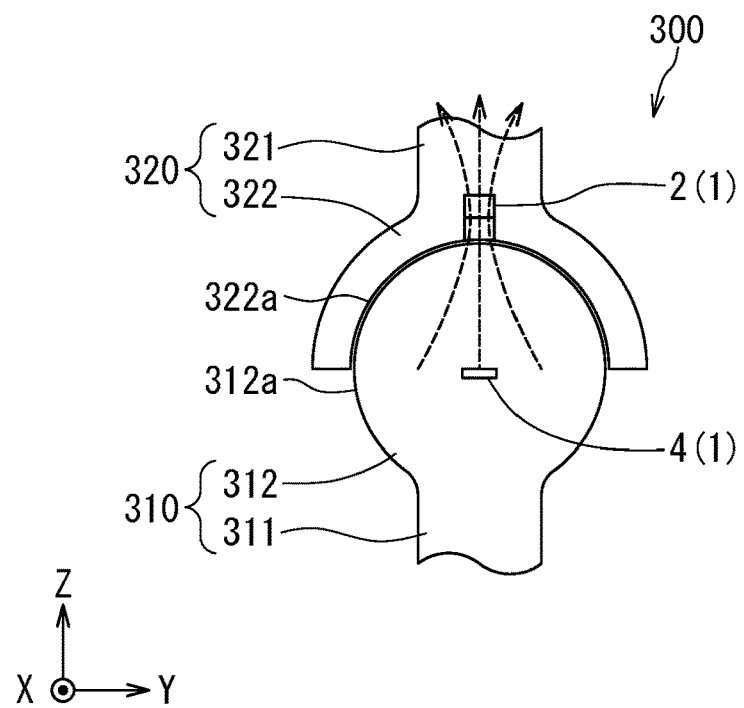
FIG. 2 is a cross-sectional view illustrating the schematic configuration of the joint mechanism illustrated in FIG. 1.
Figure 3:
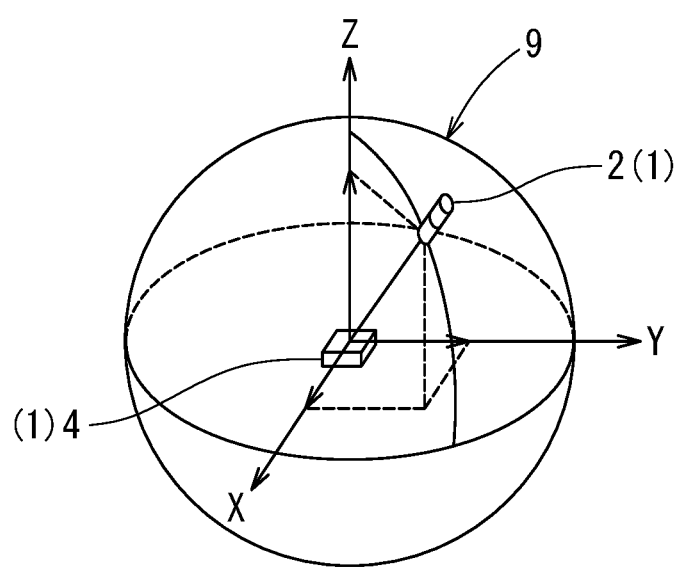
FIG. 3 is an explanatory diagram for describing a reference coordinate system in the position detection device according to the first embodiment of the invention.
Figure 4:
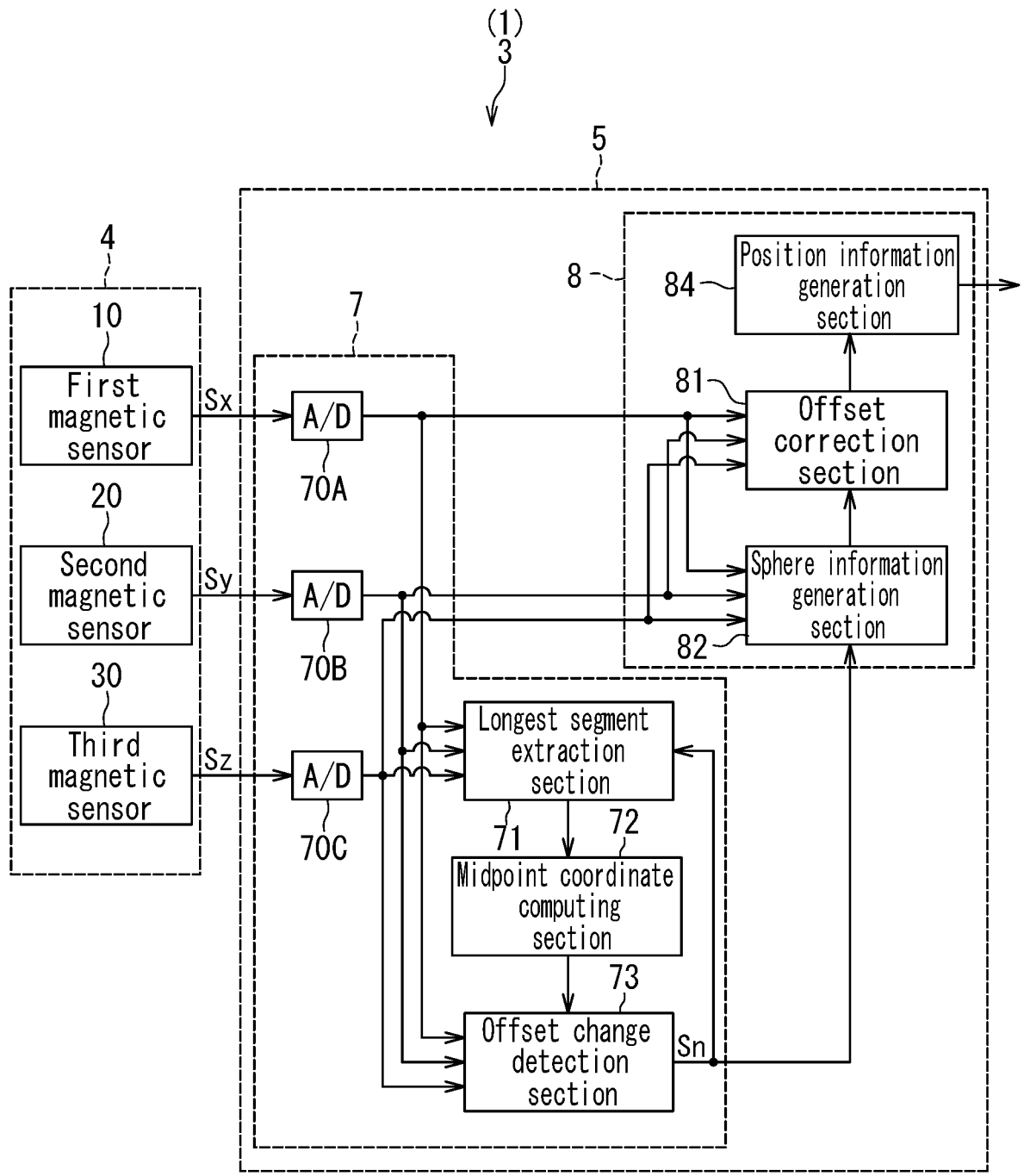
FIG. 4 is a functional block diagram illustrating a configuration of a magnetic sensor system according to the first embodiment of the invention.

Preferred embodiments of the present invention will now be described in detail with reference to the drawings. First, a description will be given of a joint mechanism 300 with a position detection device 1 according to a first embodiment of the invention applied thereto. The joint mechanism 300 is a mechanism including a joint. FIG. 1 is a perspective view illustrating a schematic configuration of the joint mechanism 300. FIG. 2 is a cross-sectional view illustrating the schematic configuration of the joint mechanism 300. FIG. 3 is an explanatory diagram for describing a reference coordinate system in the position detection device 1. FIG. 4 is a functional block diagram illustrating a configuration of a magnetic sensor system according to the present embodiment.

As illustrated in FIGS. 1 and 2, the joint mechanism 300 includes a first member 310, a second member 320, and the position detection device 1.

The first member 310 includes a shaft portion 311 and a spherical portion 312 coupled to one longitudinal end of the shaft portion 311. The spherical portion 312 includes a convex surface 312a. The convex surface 312a is constituted of part of a first spherical surface. A portion of the first spherical surface that is not included in the convex surface 312a is a border portion between the shaft portion 311 and the spherical portion 312.

The second member 320 includes a shaft portion 321 and a receptor portion 322 coupled to one longitudinal end of the shaft portion 321. The receptor portion 322 includes a concave surface 322a. The concave surface 322a is constituted of part of a second spherical surface. The concave surface 322a may be constituted of one half or almost one half of the second spherical surface.

With the spherical portion 312 fitted into the receptor portion 322, the first member 310 and the second member 320 are coupled to each other such that their positional relationship is changeable. The second spherical surface has a radius slightly greater than or equal to that of the first spherical surface. The convex surface 312a and the concave surface 322a may be in contact with each other, or opposed to each other with a lubricant therebetween. The center of the second spherical surface coincides or almost coincides with that of the first spherical surface. The coupling portion between the first and second members 310 and 320 is the joint. In the present embodiment, the joint is a ball-and-socket joint.

The position detection device 1 includes a magnetic field generator 2 and a magnetic sensor device 4. The position detection device 1 further includes a signal processing circuit 5 according to the present embodiment illustrated in FIG. 4. As illustrated in FIG. 4, the magnetic sensor device 4 and the signal processing circuit 5 constitute a magnetic sensor system 3 according to the present embodiment. The positon detection device 1 can thus be said to include the magnetic field generator 2 and the magnetic sensor system 3.

The magnetic field generator 2 is able to change its relative position with respect to the magnetic sensor device 4 along a predetermined spherical surface. The position detection device 1 is a device for detecting the relative position of the magnetic field generator 2 with respect to the magnetic sensor device 4.

The magnetic field generator 2 generates a predetermined magnetic field. An example of the magnetic field generator 2 is a magnet. The magnetic sensor device 4 generates a first detection signal, a second detection signal and a third detection signal that have correspondences with components in three mutually different directions of a magnetic field at a reference position. The reference position will be described in detail later.

The signal processing circuit 5 processes the first to third detection signals and generates position information indicating the relative position of the magnetic field generator 2 with respect to the magnetic sensor device 4.

As illustrated in FIGS. 1 and 2, the magnetic field generator 2 is embedded in the receptor portion 322 so as not to protrude from the concave surface 322a. The magnetic sensor device 4 is located inside the spherical portion 312. Hereinafter, the position of the center of the first spherical surface will be referred to as a reference position. The magnetic sensor device 4 is configured to detect a magnetic field at the reference position.

Hereinafter, a magnetic field that is a portion of the magnetic field generated by the magnetic field generator 2 and that is at the reference position will be referred to as a target magnetic field. For example, the direction of the target magnetic field is parallel to a virtual straight line passing through the reference position and the magnetic field generator 2. In the example illustrated in FIG. 2, the magnetic field generator 2 is a magnet having an N pole and an S pole arranged along the foregoing virtual straight line. The S pole is located closer to the reference position than the N pole is. The plurality of arrowed broken lines in FIG. 2 represent magnetic lines of force corresponding to the magnetic field generated by the magnetic field generator 2.

The joint mechanism 300 illustrated in FIGS. 1 and 2 is able to change the relative position of the second member 320 with respect to the first member 310, with the spherical portion 312 fitted into the receptor portion 322. This allows the magnetic field generator 2 to be able to change its relative position with respect to the magnetic sensor device 4 along the foregoing predetermined spherical surface. In the present embodiment, the relative position of the magnetic field generator 2 with respect to the magnetic sensor device 4 is represented by the position of a point closest to the reference position on the magnetic field generator 2. The center of the predetermined spherical surface coincides or almost coincides with the center of the first spherical surface. The predetermined spherical surface has a radius greater than or equal to that of the first spherical surface. The radius of the predetermined spherical surface may coincide with that of the first spherical surface or that of the second spherical surface.

Now, a description will be given of a reference coordinate system in the present embodiment with reference to FIG. 3. The reference coordinate system is an orthogonal coordinate system that is set with reference to the magnetic sensor device 4 and defined by three axes for expressing the values of the first to third detection signals. An X direction, a Y direction, and a Z direction are defined in the reference coordinate system. As illustrated in FIG. 3, the X, Y, and X directions are orthogonal to each other. The opposite directions to the X, Y, and Z directions will be expressed as −X, −Y, and −Z directions, respectively.

As described above, the magnetic sensor device 4 generates the first, second, and third detection signals having correspondences with the components in three mutually different directions of the magnetic field at the reference position. In the present embodiment, specifically, the three mutually different directions are a direction parallel to the X direction, a direction parallel to the Y direction, and a direction parallel to the Z direction. The three axes defining the reference coordinate system are an axis parallel to the X direction, an axis parallel to the Y direction, and an axis parallel to the Z direction.

The position of the magnetic sensor device 4 in the reference coordinate system remains unchanged. As the relative position of the magnetic field generator 2 with respect to the magnetic sensor device 4 changes, the position of the magnetic field generator 2 in the reference coordinate system changes along the foregoing predetermined spherical surface. In FIG. 3, the reference numeral 9 designates the predetermined spherical surface. The position of the magnetic field generator 2 in the reference coordinate system indicates the relative position of the magnetic field generator 2 with respect to the magnetic sensor device 4. Hereinafter, the position of the magnetic field generator 2 in the reference coordinate system will be simply referred to as the position of the magnetic field generator 2. An XY plane including the reference position will be referred to as a reference plane.

In the joint mechanism 300 including the position detection device 1, the position detection device 1 detects the relative position of the magnetic field generator 2 with respect to the magnetic sensor device 4, thereby enabling detection of the relative position of the second member 320 with respect to the first member 310. The joint mechanism 300 is used for robots, industrial equipment, medical equipment, amusement equipment, etc.

The position detection device 1 is applicable not only to the joint mechanism 300 but also to joysticks and trackballs.

A joystick includes, for example, a lever and a supporter that swingably supports the lever. In the case of applying the position detection device 1 to the joystick, for example, the magnetic field generator 2 is provided inside the supporter and the magnetic sensor device 4 is provided inside the lever so that the relative position of the magnetic field generator 2 with respect to the magnetic sensor device 4 changes along a predetermined spherical surface as the lever swings.

A trackball includes, for example, a ball and a supporter that rotatably supports the ball. In the case of applying the position detection device 1 to the trackball, for example, the magnetic field generator 2 is provided inside the supporter and the magnetic sensor device 4 is provided inside the ball so that the relative position of the magnetic field generator 2 with respect to the magnetic sensor device 4 changes along a predetermined spherical surface as the ball rotates.

Reference is now made to FIG. 4 to describe a configuration of the magnetic sensor device 4 and the signal processing circuit 5. The magnetic sensor device 4 generates the first detection signal Sx, the second detection signal Sy and the third detection signal Sz having correspondences with components in three mutually different directions of the target magnetic field. In the present embodiment, the first detection signal Sx has a correspondence with a first component of the target magnetic field. The first component is a component in a first sensing direction. The second detection signal Sy has a correspondence with a second component of the target magnetic field. The second component is a component in a second sensing direction. The third detection signal Sz has a correspondence with a third component of the target magnetic field. The third component is a component in a third sensing direction.

In the present embodiment, the magnetic sensor device 4 includes a first magnetic sensor 10 for generating the first detection signal Sx, a second magnetic sensor 20 for generating the second detection signal Sy, and a third magnetic sensor 30 for generating the third detection signal Sz. Each of the first to third magnetic sensors 10, 20 and 30 includes at least one magnetic detection element.

The signal processing circuit 5 includes a first processor 7 and a second processor 8. In the present embodiment, hardware that constitutes the first processor 7 is different from that constituting the second processor 8. For example, the first processor 7 is constructed of an application-specific integrated circuit (ASIC). For example, the second processor 8 is constructed of a microcomputer.

Next, a configuration of the magnetic sensor device 4 and the first processor 7 will be described. In the present embodiment, the magnetic sensor device 4 is configured as a first chip. The first processor 7 is configured as a second chip different from the first chip. The first processor 7 may be integrated with the magnetic sensor device 4. The second processor 8 may be separate from the magnetic sensor device 4 and the first processor 7. In the present embodiment, an integral unit of the magnetic sensor device 4 and the first processor 7 will be referred to as a magnetic sensor assembly 200.

Figure 5:
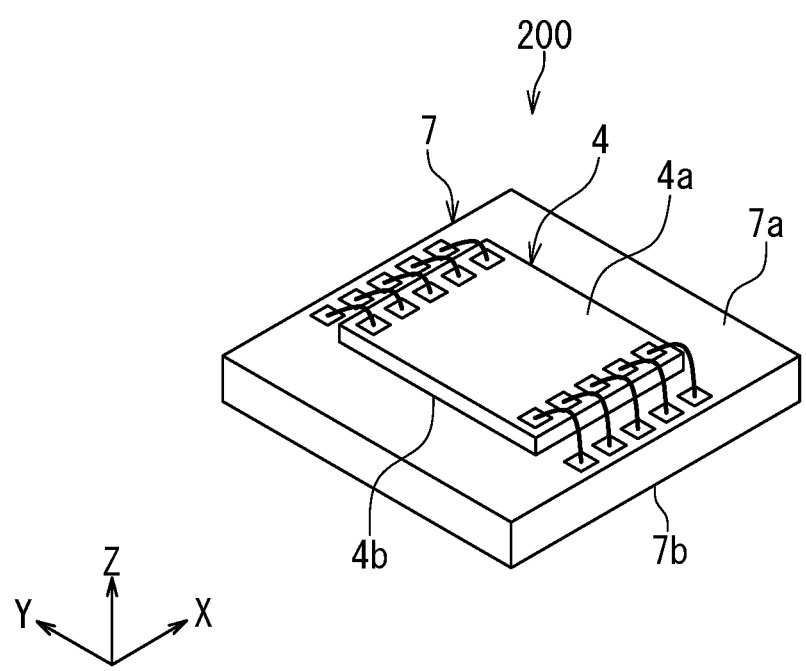
FIG. 5 is a perspective view illustrating a magnetic sensor assembly of the first embodiment of the invention.

FIG. 5 is a perspective view of the magnetic sensor assembly 200. As illustrated in FIG. 5, both the magnetic sensor device 4 and the first processor 7 have a rectangular parallelepiped shape. The magnetic sensor device 4 and the first processor 7 have their respective outer surfaces.

The outer surfaces of the magnetic sensor device 4 include a top surface 4a and a bottom surface 4b opposite to each other, and four side surfaces connecting the top surface 4a and the bottom surface 4b. The outer surfaces of the first processor 7 include a top surface 7a and a bottom surface 7b opposite to each other, and four side surfaces connecting the top surface 7a and the bottom surface 7b. The magnetic sensor device 4 is mounted on the top surface 7a of the first processor 7 in such an orientation that the bottom surface 4b faces the top surface 7a.

The magnetic sensor device 4 has a group of terminals provided on the top surface 4a. The first processor 7 has a group of terminals provided on the top surface 7a. The group of terminals of the magnetic sensor device 4 is connected to the group of terminals of the first processor 7 via a plurality of bonding wires, for example.

Figure 6:
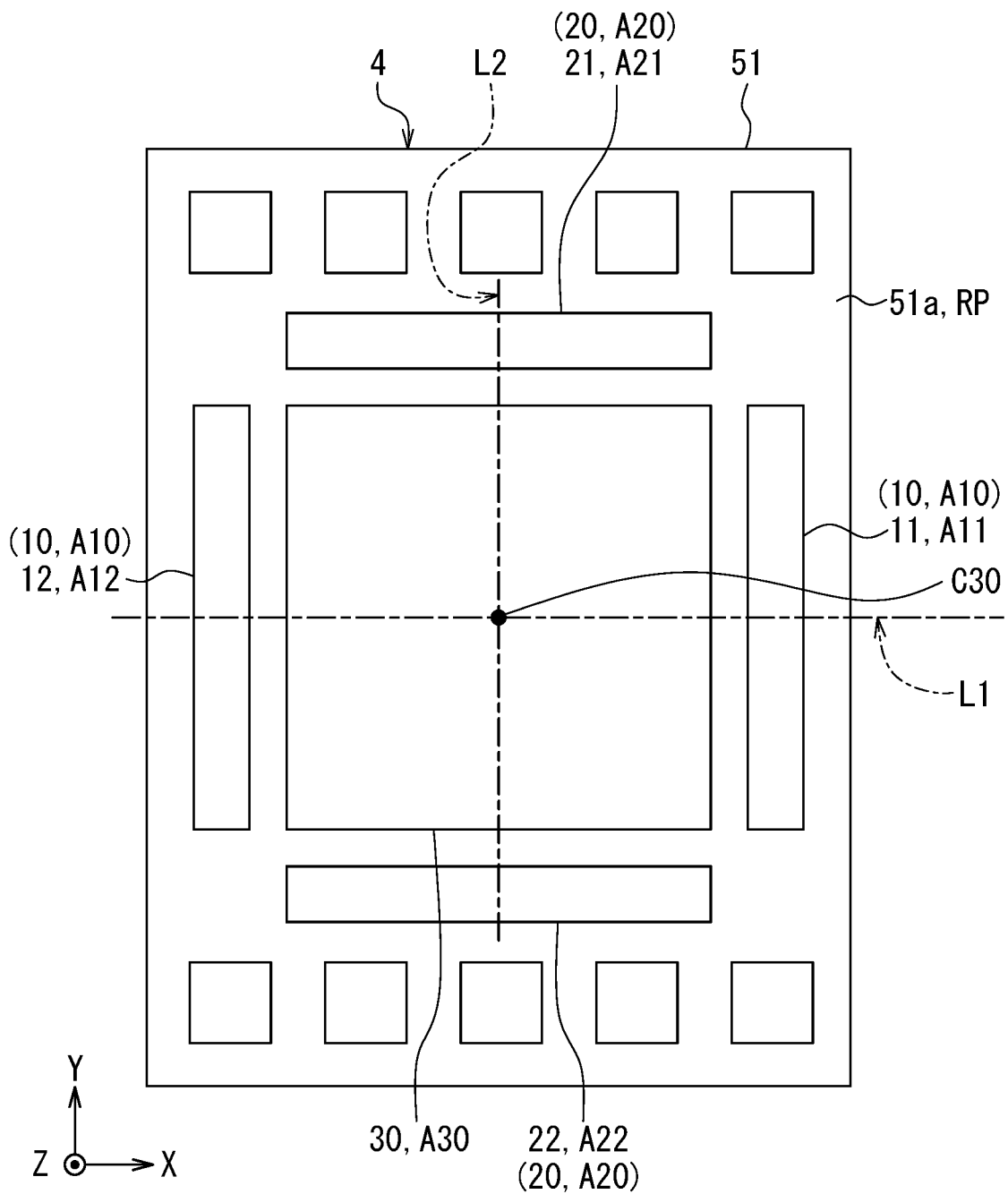
FIG. 6 is a plan view illustrating a magnetic sensor device of the first embodiment of the invention.
Figure 12:
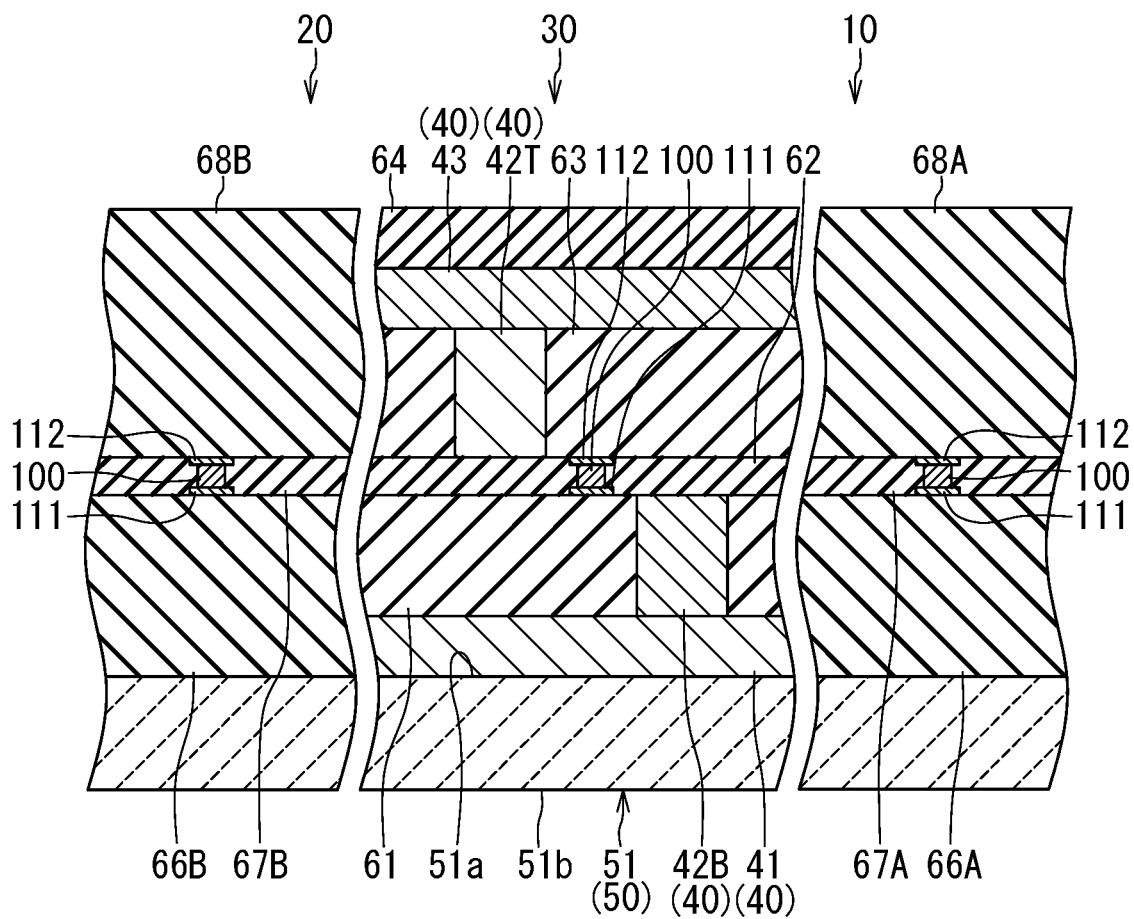
FIG. 12 is a cross-sectional view illustrating respective portions of first to third magnetic sensors and a soft magnetic structure of the first embodiment of the invention.

Next, the layout of the first to third magnetic sensors 10, 20 and 30 will be described with reference to FIG. 6. FIG. 6 is a plan view of the magnetic sensor device 4. As illustrated in FIG. 6, the magnetic sensor device 4 includes the first to third magnetic sensors 10, 20 and 30, a substrate 51 supporting the first to third magnetic sensors 10, 20 and 30, and the group of terminals. The substrate 51 has a top surface 51a and a bottom surface 51b. The bottom surface 51b is illustrated in FIG. 12 to be described later.

Now, a relationship of the components of the magnetic sensor device 4 with the reference coordinate system and the reference plane will be described with reference to FIG. 6. As described above, the X, Y, Z, -X, -Y, and -Z directions are defined in the reference coordinate system. The X and Y directions are parallel to the top surface 51a of the substrate 51. The Z direction is perpendicular to the top surface 51a of the substrate 51, and directed from the bottom surface 51b to the top surface 51a of the substrate 51. Hereinafter, the term "above" refers to positions located forward of a reference position in the Z direction, and "below" refers to positions opposite from the "above" positions with respect to the reference position. For each component of the magnetic sensor device 4, the term "top surface" refers to a surface of the component lying at the end thereof in the Z direction, and "bottom surface" refers to a surface of the component lying at the end thereof in the -Z direction.

In the present embodiment, the top surface 51a of the substrate 51 is the reference plane. Hereinafter, the reference plane will be denoted by the symbol RP. The reference plane RP includes three different areas: a first area A10; a second area A20; and a third area A30. The first area A10 is an area formed by vertically projecting the first magnetic sensor 10 onto the reference plane RP. The second area A20 is an area formed by vertically projecting the second magnetic sensor 20 onto the reference plane RP. The third area A30 is an area formed by vertically projecting the third magnetic sensor 30 onto the reference plane RP.

Here, two mutually orthogonal straight lines that are located in the reference plane RP, pass through the centroid C30 of the third area A30 and are perpendicular to the Z direction will be referred to as a first straight line L1 and a second straight line L2. In the present embodiment, specifically, the first straight line L1 is parallel to the X direction, and the second straight line L2 is parallel to the Y direction.

In the present embodiment, the first magnetic sensor 10 includes a first portion 11 and a second portion 12 located at different positions from each other in the X direction. The first area A10 includes a first partial area A11 formed by vertically projecting the first portion 11 of the first magnetic sensor 10 onto the reference plane RP, and a second partial area A12 formed by vertically projecting the second portion 12 of the first magnetic sensor 10 onto the reference plane RP. The first and second partial areas A11 and A12 are located on opposite sides of the third area A30 in a direction parallel to the first straight line L1.

The second magnetic sensor 20 includes a first portion 21 and a second portion 22 located at different positions from each other in the Y direction. The second area A20 includes a third partial area A21 formed by vertically projecting the first portion 21 of the second magnetic sensor 20 onto the reference plane RP, and a fourth partial area A22 formed by vertically projecting the second portion 22 of the second magnetic sensor 20 onto the reference plane RP. The third and fourth partial areas A21 and A22 are located on opposite sides of the third area A30 in a direction parallel to the second straight line L2.

In the present embodiment, both the first and second partial areas A11 and A12 are located to be intersected by the first straight line L1. Both the third and fourth partial areas A21 and A22 are located to be intersected by the second straight line L2.

It is desirable that no portion of the first area A10 be intersected by the second straight line L2. Likewise, it is desirable that no portion of the second area A20 be intersected by the first straight line L1.

In the present embodiment, in particular, the first area A10 and the second area A20 as viewed from above have such a positional relationship that the first area A10 coincides with the second area A20 if the first area A10 is rotated 90° around the centroid C30 of the third area A30. In FIG. 6, if the first and second partial areas A11 and A12 are rotated 90° counterclockwise around the centroid C30, the first and second partial areas A11 and A12 coincide with the third and fourth partial areas A21 and A22, respectively.

Figure 7:
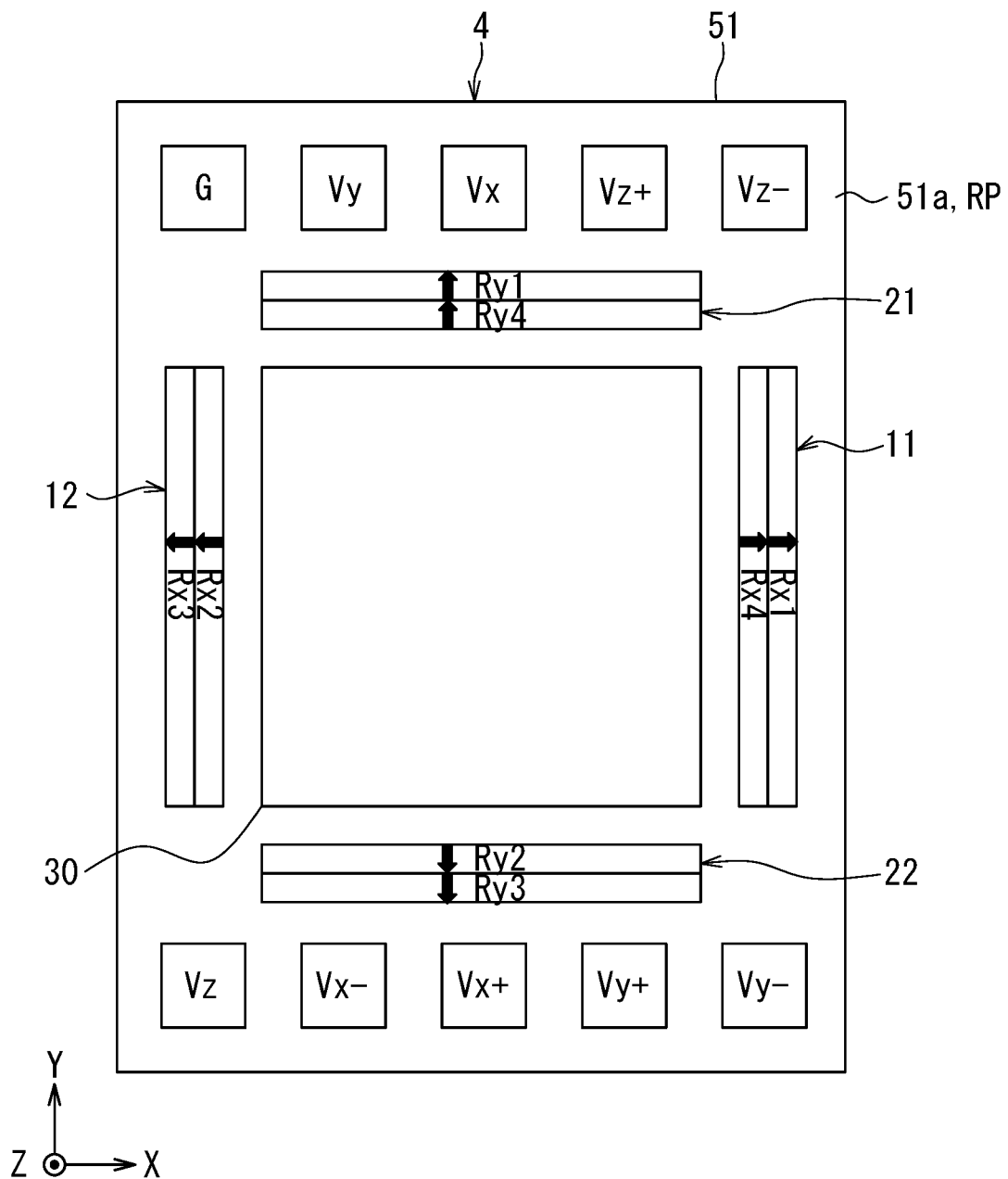
FIG. 7 is an explanatory diagram illustrating a configuration of the magnetic sensor device of the first embodiment of the invention.
Figure 8:
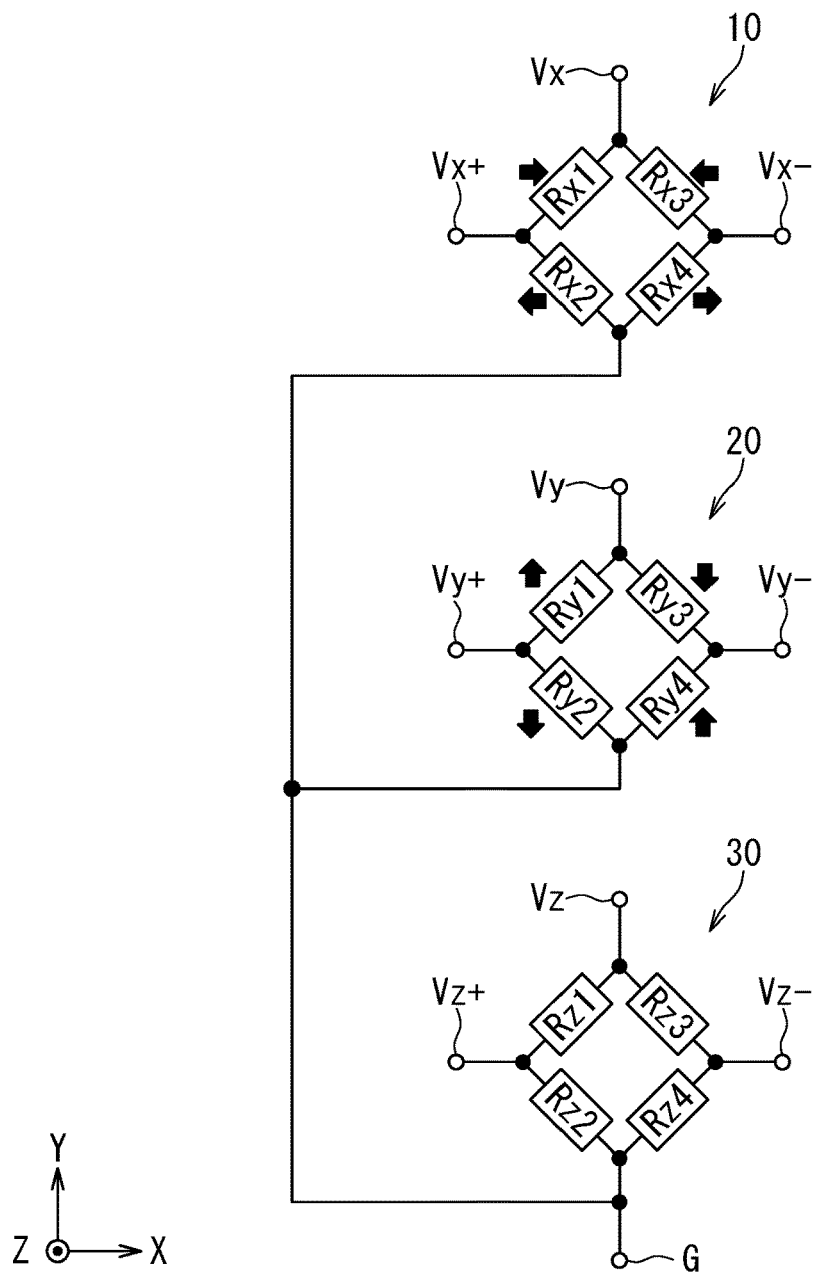
FIG. 8 is a circuit diagram illustrating an example of a circuit configuration of the magnetic sensor device of the first embodiment of the invention.

An example configuration of the magnetic sensor device 4 will now be described with reference to FIG. 7 and FIG. 8. FIG. 7 is an explanatory diagram illustrating the configuration of the magnetic sensor device 4. FIG. 8 is a circuit diagram illustrating an example of a circuit configuration of the magnetic sensor device 4.

As described above, the first magnetic sensor 10 generates the first detection signal Sx having a correspondence with the first component, i.e., a component in the first sensing direction, of the target magnetic field. The second magnetic sensor 20 generates the second detection signal Sy having a correspondence with the second component, i.e., a component in the second sensing direction, of the target magnetic field. The third magnetic sensor 30 generates the third detection signal Sz having a correspondence with the third component, i.e., a component in the third sensing direction, of the target magnetic field.

In the present embodiment, specifically, the first sensing direction is a direction parallel to the X direction. The first sensing direction includes the X direction and the -X direction. The second sensing direction is a direction parallel to the Y direction. The second sensing direction includes the Y direction and the -Y direction. The third sensing direction is a direction parallel to the Z direction. The third sensing direction includes the Z direction and the -Z direction.

As illustrated in FIG. 7, the group of terminals of the magnetic sensor device 4 includes: a power supply terminal Vx and output terminals Vx+ and Vx− associated with the first magnetic sensor 10; a power supply terminal Vy and output terminals Vy+ and Vy− associated with the second magnetic sensor 20; a power supply terminal Vz and output terminals Vz+ and Vz− associated with the third magnetic sensor 30; and a ground terminal G shared among the first to third magnetic sensors 10, 20 and 30.

In the example illustrated in FIG. 8, the first magnetic sensor 10 includes four resistor sections Rx1, Rx2, Rx3 and Rx4 constituting a Wheatstone bridge circuit. Each of the resistor sections Rx1, Rx2, Rx3 and Rx4 has a resistance that varies depending on the first component of the target magnetic field. The resistor section Rx1 is provided between the power supply terminal Vx and the output terminal Vx+. The resistor section Rx2 is provided between the output terminal Vx+ and the ground terminal G The resistor section Rx3 is provided between the power supply terminal Vx and the output terminal Vx−. The resistor section Rx4 is provided between the output terminal Vx− and the ground terminal G.

The second magnetic sensor 20 includes four resistor sections Ry1, Ry2, Ry3 and Ry4 constituting a Wheatstone bridge circuit. Each of the resistor sections Ry1, Ry2, Ry3 and Ry4 has a resistance that varies depending on the second component of the target magnetic field. The resistor section Ry1 is provided between the power supply terminal Vy and the output terminal Vy+. The resistor section Ry2 is provided between the output terminal Vy+ and the ground terminal G The resistor section Ry3 is provided between the power supply terminal Vy and the output terminal Vy−. The resistor section Ry4 is provided between the output terminal Vy− and the ground terminal G The third magnetic sensor 30 includes four resistor sections Rz1, Rz2, Rz3 and Rz4 constituting a Wheatstone bridge circuit. Each of the resistor sections Rz1, Rz2, Rz3 and Rz4 has a resistance that varies depending on an output magnetic field component output from a magnetic field conversion section, which will be described later. The resistor section Rz1 is provided between the power supply terminal Vz and the output terminal Vz+. The resistor section Rz2 is provided between the output terminal Vz+ and the ground terminal G. The resistor section Rz3 is provided between the power supply terminal Vz and the output terminal Vz−. The resistor section Rz4 is provided between the output terminal Vz− and the ground terminal G Hereinafter, the term "resistor section R" is used to refer to any one of the resistor sections Rx1, Rx2, Rx3, Rx4, Ry1, Ry2, Ry3, Ry4, Rz1, Rz2, Rz3, and Rz4. Each resistor section R includes at least one magnetic detection element. In the present embodiment, the at least one magnetic detection element is specifically at least one magnetoresistive element. The magnetoresistive element will hereinafter be referred to as MR element.

In the present embodiment, the MR element is specifically a spin-valve MR element. The spin-valve MR element includes a magnetization pinned layer having a magnetization in a fixed direction, a free layer having a magnetization whose direction is variable depending on the direction of an applied magnetic field, and a gap layer located between the magnetization pinned layer and the free layer. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°. In each MR element, the free layer has a shape anisotropy that sets the direction of the magnetization easy axis to be orthogonal to the magnetization direction of the magnetization pinned layer.

In FIG. 8, the filled arrows indicate the magnetization directions of the magnetization pinned layers of the MR elements. In the example illustrated in FIG. 8, the magnetization pinned layers of the MR elements in each of the resistor sections Rx1 and Rx4 are magnetized in the X direction. The magnetization pinned layers of the MR elements in each of the resistor sections Rx2 and Rx3 are magnetized in the −X direction.

The magnetization pinned layers of the MR elements in each of the resistor sections Ry1 and Ry4 are magnetized in the Y direction. The magnetization pinned layers of the MR elements in each of the resistor sections Ry2 and Ry3 are magnetized in the −Y direction. The magnetization directions of the magnetization pinned layers of the MR elements in each of the resistor sections Rz1, Rz2, Rz3 and Rz4 will be described later.

A potential difference between the output terminals Vx+ and Vx− has a correspondence with the first component of the target magnetic field. The first magnetic sensor 10 generates the first detection signal Sx corresponding to the potential difference between the output terminals Vx+ and Vx−. The first detection signal Sx may be one obtained by adjusting the amplitude or offset of the potential difference between the output terminals Vx+ and Vx−.

A potential difference between the output terminals Vy+ and Vy− has a correspondence with the second component of the target magnetic field. The second magnetic sensor 20 generates the second detection signal Sy corresponding to the potential difference between the output terminals Vy+ and Vy−. The second detection signal Sy may be one obtained by adjusting the amplitude or offset of the potential difference between the output terminals Vy+ and Vy−.

A potential difference between the output terminals Vz+ and Vz− has a correspondence with the third component of the target magnetic field. The third magnetic sensor 30 generates the third detection signal Sz corresponding to the potential difference between the output terminals Vz+ and Vz−. The third detection signal Sz may be one obtained by adjusting the amplitude or offset of the potential difference between the output terminals Vz+ and Vz−.

Reference is now made to FIG. 7 to describe an example layout of the resistor sections Rx1, Rx2, Rx3, Rx4, Ry1, Ry2, Ry3, and Ry4. In this example, the first portion 11 of the first magnetic sensor 10 includes the resistor sections Rx1 and Rx4, and the second portion 12 of the first magnetic sensor 10 includes the resistor sections Rx2 and Rx3. The first portion 21 of the second magnetic sensor 20 includes the resistor sections Ry1 and Ry4, and the second portion 22 of the second magnetic sensor 20 includes the resistor sections Ry2 and Ry3.

In FIG. 7, the filled arrows indicate the magnetization directions of the magnetization pinned layers of the MR elements. In the example illustrated in FIG. 7, in each of the first portion 11 of the first magnetic sensor 10, the second portion 12 of the first magnetic sensor 10, the first portion 21 of the second magnetic sensor 20, and the second portion 22 of the second magnetic sensor 20, the magnetization pinned layers of the MR elements included therein have the same magnetization direction. Such an example makes it easy to set the magnetization directions of the magnetization pinned layers in a plurality of MR elements.

An example configuration of MR elements will now be described with reference to FIG. 9. An MR element 100 illustrated in FIG. 9 includes an antiferromagnetic layer 101, a magnetization pinned layer 102, a gap layer 103, and a free layer 104 which are stacked in this order, from closest to farthest from the substrate 51. The antiferromagnetic layer 101 is formed of an antiferromagnetic material, and is in exchange coupling with the magnetization pinned layer 102 to thereby pin the magnetization direction of the magnetization pinned layer 102.

Figure 9:
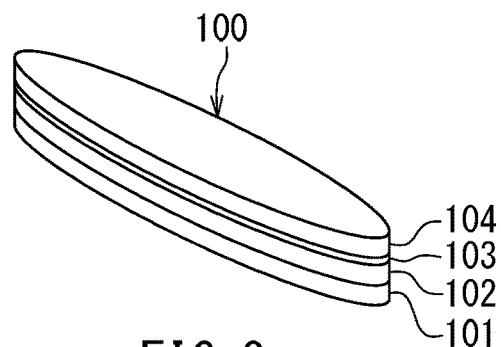
FIG. 9 is a perspective view illustrating a magnetoresistive element of the first embodiment of the invention.

The layers 101 to 104 of the MR element 100 may be stacked in the reverse order to that illustrated in FIG. 9. The magnetization pinned layer 102 need not necessarily be a single ferromagnetic layer but may have an artificial antiferromagnetic structure including two ferromagnetic layers and a nonmagnetic metal layer interposed between the two ferromagnetic layers. The MR element 100 may be configured without the antiferromagnetic layer 101. The magnetic detection element may be an element for detecting a magnetic field other than the MR element, such as a Hall element or a magnetic impedance element.

Figure 10:
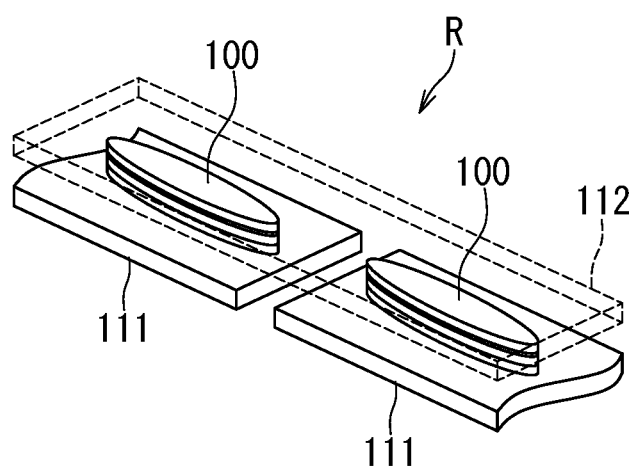
FIG. 10 is a perspective view illustrating part of a resistor section of the first embodiment of the invention.

Next, an example configuration of the resistor section R will be described with reference to FIG. 10. In this example, the resistor section R includes a plurality of MR elements 100 connected in series. The resistor section R further includes one or more connection layers for electrically connecting two MR elements 100 that are adjacent to each other in circuit configuration, so that the plurality of MR elements 100 are connected in series. In the example illustrated in FIG. 10 the resistor section R includes, as the one or more connection layers, one or more lower connection layers 111 and one or more upper connection layers 112. The lower connection layer 111 is in contact with the bottom surfaces of two MR elements 100 adjacent to each other in circuit configuration, and electrically connects the two MR elements 100. The upper connection layer 112 is in contact with the top surfaces of two MR elements 100 adjacent to each other in circuit configuration, and electrically connects the two MR elements 100.

Next, an example configuration of the third magnetic sensor 30 will be described with reference to FIG. 11. The third magnetic sensor 30 includes a soft magnetic structure 40 formed of a soft magnetic material, in addition to the resistor sections Rz1, Rz2, Rz3 and Rz4. The soft magnetic structure 40 includes a magnetic field conversion section 42 and at least one soft magnetic layer. The magnetic field conversion section 42 receives the third component of the target magnetic field and outputs an output magnetic field component that is in a direction perpendicular to the third sensing direction. The strength of the output magnetic field component has a correspondence with the strength of the third component of the target magnetic field. The third magnetic sensor 30 detects the strength of the third component of the target magnetic field by detecting the strength of the output magnetic field component.

Figure 11:
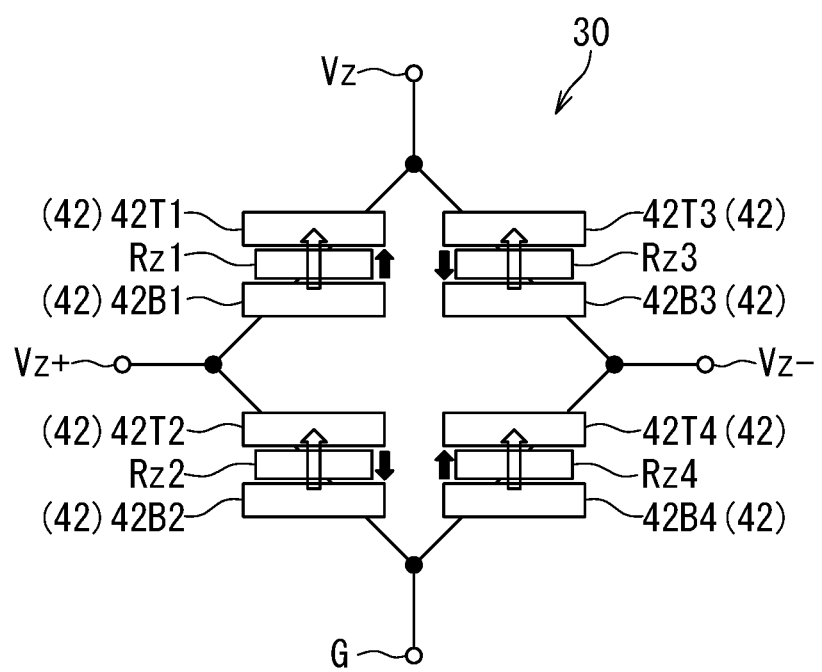
FIG. 11 is an explanatory diagram illustrating configurations of a magnetic field conversion section and a third magnetic sensor of the first embodiment of the invention.

In the example illustrated in FIG. 11, the magnetic field conversion section 42 includes: a lower yoke 42B1 and an upper yoke 42T1 associated with the resistor section Rz1; a lower yoke 42B2 and an upper yoke 42T2 associated with the resistor section Rz2; a lower yoke 42B3 and an upper yoke 42T3 associated with the resistor section Rz3; and a lower yoke 42B4 and an upper yoke 42T4 associated with the resistor section Rz4.

The lower yokes 42B1, 42B2, 42B3 and 42B4 and the upper yokes 42T1, 42T2, 42T3 and 42T4 each have a rectangular parallelepiped shape elongated in a direction perpendicular to the Z direction.

The lower yoke 42B1 and the upper yoke 42T1 are located near the resistor section Rz1. The lower yoke 42B1 is located closer to the top surface 51a of the substrate 51 than the resistor section Rz1. The upper yoke 42T1 is located farther from the top surface 51a of the substrate 51 than the resistor section Rz1. As viewed from above, the resistor section Rz1 lies between the lower yoke 42B1 and the upper yoke 42T1.

The lower yoke 42B2 and the upper yoke 42T2 are located near the resistor section Rz2. The lower yoke 42B2 is located closer to the top surface 51a of the substrate 51 than the resistor section Rz2. The upper yoke 42T2 is located farther from the top surface 51a of the substrate 51 than the resistor section Rz2. As viewed from above, the resistor section Rz2 lies between the lower yoke 42B2 and the upper yoke 42T2.

The lower yoke 42B3 and the upper yoke 42T3 are located near the resistor section Rz3. The lower yoke 42B3 is located closer to the top surface 51a of the substrate 51 than the resistor section Rz3. The upper yoke 42T3 is located farther from the top surface 51a of the substrate 51 than the resistor section Rz3. As viewed from above, the resistor section Rz3 lies between the lower yoke 42B3 and the upper yoke 42T3.

The lower yoke 42B4 and the upper yoke 42T4 are located near the resistor section Rz4. The lower yoke 42B4 is located closer to the top surface 51a of the substrate 51 than the resistor section Rz4. The upper yoke 42T4 is located farther from the top surface 51a of the substrate 51 than the resistor section Rz4. As viewed from above, the resistor section Rz4 lies between the lower yoke 42B4 and the upper yoke 42T4.

The output magnetic field component output by the magnetic field conversion section 42 contains a magnetic field component that is generated by the lower yoke 42B1 and the upper yoke 42T1 and applied to the resistor section Rz1, a magnetic field component that is generated by the lower yoke 42B2 and the upper yoke 42T2 and applied to the resistor section Rz2, a magnetic field component that is generated by the lower yoke 42B3 and the upper yoke 42T3 and applied to the resistor section Rz3, and a magnetic field component that is generated by the lower yoke 42B4 and the upper yoke 42T4 and applied to the resistor section Rz4.

In FIG. 11, the four hollow arrows indicate the direction of the magnetic field components applied to the resistor sections Rz1, Rz2, Rz3 and Rz4 when the third component of the target magnetic field is in the Z direction. On the other hand, in FIG. 11 the four filled arrows indicate the magnetization directions of the magnetization pinned layers 102 of the MR elements 100 of the resistor sections Rz1, Rz2, Rz3 and Rz4, respectively. The magnetization directions of the magnetization pinned layers 102 of the MR elements 100 of the resistor sections Rz1 and Rz4 are the same as the directions of the magnetic field components that are applied to the resistor sections Rz1 and Rz4, respectively, when the third component of the target magnetic field is in the Z direction. The magnetization directions of the magnetization pinned layers 102 of the MR elements 100 of the resistor sections Rz2 and Rz3 are opposite to the directions of the magnetic field components that are applied to the resistor sections Rz2 and Rz3, respectively, when the third component of the target magnetic field is in the Z direction.

Now, the function of the third magnetic sensor 30 will be described. When there is no third component of the target magnetic field, the magnetization direction of the free layer 104 of each MR element 100 in the resistor sections Rz1, Rz2, Rz3 and Rz4 is perpendicular to the magnetization direction of the magnetization pinned layer 102.

If the third component of the target magnetic field is in the Z direction, the magnetization direction of the free layer 104 of each MR element 100 in the resistor sections Rz1 and Rz4 tilts toward the magnetization direction of the magnetization pinned layer 102 from the direction perpendicular to the magnetization direction of the magnetization pinned layer 102. On the other hand, the magnetization direction of the free layer 104 of each MR element 100 in the resistor sections Rz2 and Rz3 tilts toward a direction opposite to the magnetization direction of the magnetization pinned layer 102 from the direction perpendicular to the magnetization direction of the magnetization pinned layer 102. As a result, the resistor sections Rz1 and Rz4 decrease in resistance while the resistor sections Rz2 and Rz3 increase in resistance, compared to when there is no third component of the target magnetic field.

In contrast to this, if the third component of the target magnetic field is in the −Z direction, the resistor sections Rz1 and Rz4 increase in resistance while the resistor sections Rz2 and Rz3 decrease in resistance, compared to when there is no third component of the target magnetic field.

The amount of change in the resistance of each of the resistor sections Rz1, Rz2, Rz3 and Rz4 depends on the strength of the third component of the target magnetic field.

Changes in the direction and strength of the third component of the target magnetic field cause the resistor sections Rz1, Rz2, Rz3 and Rz4 to change in resistance such that the resistor sections Rz1 and Rz4 increase in resistance while the second and third resistor sections Rz2 and Rz3 decrease in resistance, or such that the resistor sections Rz1 and Rz4 decrease in resistance while the resistor sections Rz2 and Rz3 increase in resistance. This causes a change in a potential difference between the output terminals Vz+ and Vz−. It is thus possible to detect the third component of the target magnetic field based on the potential difference. The third magnetic sensor 30 generates the third detection signal Sz corresponding to the potential difference between the output terminals Vz+ and Vz−. The third detection signal Sz may be one obtained by adjusting the amplitude or offset of the potential difference between the output terminals Vz+ and Vz−.

Reference is now made to FIG. 12 to describe an example structure of the first to third magnetic sensors 10, 20 and 30. FIG. 12 shows a portion of each of the first to third magnetic sensors 10, 20 and 30. In this example, the first to third magnetic sensors 10, 20 and 30 are disposed on the substrate 51. The substrate 51 has the top surface 51a and the bottom surface 51b.

The first magnetic sensor 10 includes insulating layers 66A, 67A and 68A each formed of an insulating material, in addition to the resistor sections Rx1, Rx2, Rx3 and Rx4. The insulating layer 66A lies on the top surface 51a of the substrate 51. The resistor sections Rx1, Rx2, Rx3 and Rx4 are arranged on the insulating layer 66A. FIG. 12 shows one of the plurality of MR elements 100 included in the resistor sections Rx1, Rx2, Rx3 and Rx4, and also the upper connection layer 112 and the lower connection layer 111 connected to the MR element 100. The insulating layer 67A lies on the top surface of the insulating layer 66A and surrounds the resistor sections Rx1, Rx2, Rx3 and Rx4. The insulating layer 68A covers the resistor sections Rx1, Rx2, Rx3 and Rx4 and the insulating layer 67A.

The second magnetic sensor 20 is structurally similar to the first magnetic sensor 10. More specifically, the second magnetic sensor 20 includes insulating layers 66B, 67B and 68B each formed of an insulating material, in addition to the resistor sections Ry1, Ry2, Ry3 and Ry4. The insulating layer 66B lies on the top surface 51a of the substrate 51. The resistor sections Ry1, Ry2, Ry3 and Ry4 are arranged on the insulating layer 66B. FIG. 12 shows one of the plurality of MR elements 100 included in the resistor sections Ry1, Ry2, Ry3 and Ry4, and also the upper connection layer 112 and the lower connection layer 111 connected to the MR element 100. The insulating layer 67B lies on the top surface of the insulating layer 66B and surrounds the resistor sections Ry1, Ry2, Ry3 and Ry4. The insulating layer 68B covers the resistor sections Ry1, Ry2, Ry3 and Ry4 and the insulating layer 67B.

The third magnetic sensor 30 includes insulating layers 61, 62, 63 and 64 each formed of an insulating material, in addition to the resistor sections Rz1, Rz2, Rz3 and Rz4 and the soft magnetic structure 40. In the example illustrated in FIG. 12, the soft magnetic structure 40 includes the magnetic field conversion section 42 and two soft magnetic layers 41 and 43.

The magnetic field conversion section 42 includes the lower yokes 42B1, 42B2, 42B3 and 42B4 and the upper yokes 42T1, 42T2, 42T3 and 42T4 illustrated in FIG. 11. In FIG. 12, one of the lower yokes 42B1, 42B2, 42B3 and 42B4 is denoted by the reference symbol 42B, and a corresponding one of the upper yokes 42T1, 42T2, 42T3 and 42T4 is denoted by the reference symbol 42T.

The soft magnetic layer 41 lies on the top surface 51a of the substrate 51. The lower yokes 42B1, 42B2, 42B3 and 42B4 are arranged on the soft magnetic layer 41. The insulating layer 61 lies on the soft magnetic layer 41 and surrounds the lower yokes 42B1, 42B2, 42B3 and 42B4.

The resistor sections Rz1, Rz2, Rz3 and Rz4 are arranged on the insulating layer 61. FIG. 12 shows one of the plurality of MR elements 100 included in the resistor sections Rz1, Rz2, Rz3 and Rz4, and also the upper connection layer 112 and the lower connection layer 111 connected to the MR element 100. The insulating layer 62 lies on the lower yokes 42B1, 42B2, 42B3 and 42B4 and the insulating layer 61, and surrounds the resistor sections Rz1, Rz2, Rz3 and Rz4.

The upper yokes 42T1, 42T2, 42T3 and 42T4 are arranged on the insulating layer 62. The insulating layer 63 lies on the resistor sections Rz1, Rz2, Rz3 and Rz4 and the insulating layer 62, and surrounds the upper yokes 42T1, 42T2, 42T3 and 42T4.

The soft magnetic layer 43 lies on the upper yokes 42T1, 42T2, 42T3 and 42T4 and the insulating layer 63. The insulating layer 64 covers the soft magnetic layer 43.

As viewed from above, the soft magnetic layers 41 and 43 extend across the entire area or almost the entire area of the third magnetic sensor 30. In other words, both of an area formed by vertically projecting the soft magnetic layer 41 onto the reference plane RP and an area formed by vertically projecting the soft magnetic layer 43 onto the reference plane RP coincide with or almost coincide with the third area A30.

In the example illustrated in FIG. 12, all the magnetic detection elements or MR elements 100 included in the first to third magnetic sensors 10, 20 and 30 are located at the same distance from the top surface 51a of the substrate 51, i.e., the reference plane RP.

The magnetic field conversion section 42 may include only either the lower yokes 42B1, 42B2, 42B3 and 42B4 or the upper yokes 42T1, 42T2, 42T3 and 42T4. The soft magnetic structure 40 may include only either one of the soft magnetic layers 41 and 43.

Next, details of processing performed by the signal processing circuit 5 and a configuration of the signal processing circuit 5 will be described with reference to FIG. 4. The signal processing circuit 5 performs first processing, second processing, offset change detection processing, sphere information generation processing, offset correction processing, and position information generation processing. As described above, the signal processing circuit 5 includes the first processor 7 and the second processor 8. The first processor 7 includes analog-to-digital converters (hereinafter, referred to as A/D converters) 70A, 70B and 70C, a longest segment extraction section 71 that performs the first processing, a midpoint coordinate computing section 72 that performs the second processing, and an offset change detection section 73 that performs the offset change detection processing. The second processor 8 includes an offset correction section 81 that performs the offset correction processing, a sphere information generation section 82 that performs the sphere information generation processing, and a position information generation section 84 that performs the position information generation processing.

The longest segment extraction section 71, the midpoint coordinate computing section 72, the offset change detection section 73, the offset correction section 81, the sphere information generation section 82, and the position information generation section 84 are functional blocks for performing the respective processing described above.

The A/D converters 70A, 70B, and 70C convert the first, second, and third detection signals Sx, Sy, and Sz into digital form, respectively. The first to third detection signals Sx, Sy, and Sz converted into digital form are input to the longest segment extraction section 71, the offset change detection section 73, the offset correction section 81, and the sphere information generation section 82.

The first processing, the second processing, the offset change detection processing, the sphere information generation processing, the offset correction processing, and the position information generation processing are each repeated during use of the position detection device 1.

Here, coordinates (Sx, Sy, Sz) representing a set of values of the first to third detection signals Sx, Sy, and Sz at a certain timing in the foregoing reference coordinate system are taken as a measurement point. As described above, a change in the relative position of the magnetic field generator 2 with respect to the magnetic sensor device 4 causes the position of the magnetic field generator 2 in the reference coordinate system to change along a predetermined spherical surface. Accordingly, if a plurality of measurement points at a plurality of timings are obtained and plotted on the reference coordinate system, the distribution of the plurality of measurement points can be approximated by a spherical surface. In the present embodiment, the spherical surface approximating the distribution of the plurality of measurement points will be referred to as an approximate spherical surface. The plurality of measurement points are distributed over the approximate spherical surface or near the approximate spherical surface.

The first processing by the longest segment extraction section 71 includes extracting a first point and a second point that define a line segment having the greatest length among the plurality of measurement points at the plurality of timings, and outputting the first point and the second point to the midpoint coordinate computing section 72.

The second processing by the midpoint coordinate computing section 72 includes, after the execution of the first processing, determining the coordinates of the midpoint of the line segment defined by the first and second points extracted by the first processing and one half of the length of the line segment defined by the first and second points. One half of the length of the line segment defined by the first and second points will hereinafter be referred to as magnetic field strength data M. The second processing by the midpoint coordinate computing section 72 further includes storing the coordinates of the midpoint and the magnetic field strength data M. The coordinates of the midpoint correspond to estimated center coordinates of a virtual sphere having the approximate spherical surface. The magnetic field strength data M corresponds to data on the estimated radius of the virtual sphere. In the following description, the set of the coordinates of the midpoint and the magnetic field strength data M will be referred to as estimated sphere information.

Hereinafter, the coordinates of the first point will be represented as (x1, y1, z1). The coordinates of the second point will be represented as (x2, y2, z2). The coordinates of the midpoint of the line segment defined by the first and second points will be represented as (mx, my, mz), where mx, my, and mz are expressed by the following Eqs. (1) to (3), respectively.

$$mx=(x1+x2)/2 \qquad (1)$$

$$my=(y1+y2)/2 \qquad (2)$$

$$mz=(z1+z2)/2 \qquad (3)$$

The magnetic field strength data M is expressed by the following Eq. (4).

$$M=\sqrt{((x1-x2)^2+(y1-y2)^2+(z1-z2)^2)}/2 \qquad (4)$$

Offsets occur in the first to third detection signals Sx, Sy, and Sz due to factors other than the target magnetic field which is a magnetic field generated by the magnetic field generator 2. The offset change detection processing by the offset change detection section 73 includes detecting a change in the offsets of the first to third detection signals Sx, Sy, and Sz by using the estimated sphere information stored by the second processing.

Upon detection of a change in the offsets, the offset change detection section 73 outputs a notification signal Sn indicating the change, and stops the offset change detection processing. In the present embodiment, the longest segment extraction section 71 is configured to be capable of receiving the notification signal Sn, and is configured to start the first processing if the notification signal Sn is received. In other words, if a change in the offsets is detected, the offset change detection section 73 outputs the notification signal Sn to the longest segment extraction section 71 to allow the first processing to get started. The second processing by the midpoint coordinate computing section 72 includes determining the coordinates of the midpoint of the line segment defined by the first and second points and the magnetic field strength data M upon extraction of the first and second points by the first processing, and updating the stored estimated sphere information. The offset change detection section 73 resumes the offset change detection processing if the estimated sphere information is updated by the midpoint coordinate computing section 72 after the output of the notification signal Sn.

Before the offset change detection processing is executed for the first time after the position detection device 1 starts to be used, the first processor 7 may execute the following initial processing. In the initial processing, the longest segment extraction section 71 initially performs the first processing to extract the first and second points. Next, the midpoint coordinate computing section 72 performs the second processing to determine the coordinates of the midpoint of the line segment defined by the first and second points and the magnetic field strength data M, and stores the coordinates and the magnetic field strength data M as estimated sphere information. The offset change detection section 73 then starts the offset change detection processing.

Alternatively, instead of the execution of the foregoing initial processing, the midpoint coordinate computing section 72 may store initial estimated sphere information. The initial estimated sphere information includes initial values of the coordinates of the midpoint and an initial value of the magnetic field strength data M. For example, the initial values of the coordinates of the midpoint and the initial value of the magnetic field strength data M are determined before shipment of an apparatus including the joint mechanism 300, on the basis of the configuration of the joint mechanism 300 to which the position detection device 1 is applied. In the offset change detection processing executed for the first time after the position detection device 1 starts to be used, the offset change detection section 73 detects a change in the offsets by using the initial values of the coordinates of the midpoint and the initial value of the magnetic field strength data M instead of the coordinates of the midpoint and the magnetic field strength data M.

The sphere information generation processing by the sphere information generation section 82 includes generating sphere information Ss by computation using the first to third detection signals Sx, Sy, and Sz. The sphere information Ss includes data on the center coordinates and radius of the virtual sphere having the approximate spherical surface. For example, the center coordinates and radius of a virtual sphere may be determined by determining an approximate spherical surface including four measurement points using the four measurement points and the equation of the spherical surface. Alternatively, the center coordinates and radius of the virtual sphere may be determined by determining an approximate spherical surface closest to five or more measurement points using the five or more measurement points, the equation of the spherical surface, and the least squares method.

In the present embodiment, the sphere information generation section 82 is configured to be capable of receiving the notification signal Sn, and is configured to start the sphere information generation processing if the notification signal Sn is received. In other words, the offset change detection processing by the offset change detection section 73 includes, upon detection of a change in the offsets, outputting the notification signal Sn to the sphere information generation section 82 to allow the sphere information generation processing to get started.

The offset correction processing by the offset correction section 81 includes, after the execution of the sphere information generation processing, correcting the offsets of the first to third detection signals Sx, Sy, and Sz to generate first to third corrected signals by using the first to third detection signals Sx, Sy, and Sz and the data on the center coordinates included in the sphere information Ss generated by the sphere information generation processing, and outputting the first to third corrected signals to the position information generation section 84.

The sphere information generation section 82 may perform the sphere information generation processing before the offset change detection processing is executed for the first time after the position detection device 1 starts to be used. Alternatively, the sphere information generation section 82 may store initial sphere information in advance. The initial sphere information includes the data on the initial values of the center coordinates and the initial value of the radius of the virtual sphere. For example, the data on the initial values of the center coordinates and the initial value of the radius are determined before shipment of the apparatus including the joint mechanism 300, on the basis of the configuration of the joint mechanism 300 to which the position detection device 1 is applied. Before the sphere information generation processing is executed for the first time after the position detection device 1 starts to be used, the offset correction section 81 may perform the offset correction processing by using the data on the initial values of the center coordinates instead of the data on the center coordinates.

The initial values of the coordinates of the foregoing midpoint may be the same as the initial values of the center coordinates. Similarly, the initial value of the foregoing magnetic field strength data M may be the same as the initial value of the radius.

The position information generation processing by the position information generation section 84 includes generating the position information indicating the relative position of the magnetic field generator 2 with respect to the magnetic sensor device 4 on the basis of the first to third corrected signals.

Now, the first processing by the longest segment extraction section 71 will be described concretely. In the first processing, a plurality of measurement points at a plurality of timings are obtained, and the first and second points are extracted from among the plurality of measurement points. Examples of the method of extracting the first and second points include a first, a second and a third method described below. In the first to third methods, the longest segment extraction section 71 obtains the plurality of measurement points at the plurality of timings as time-series data.

Figure 13:
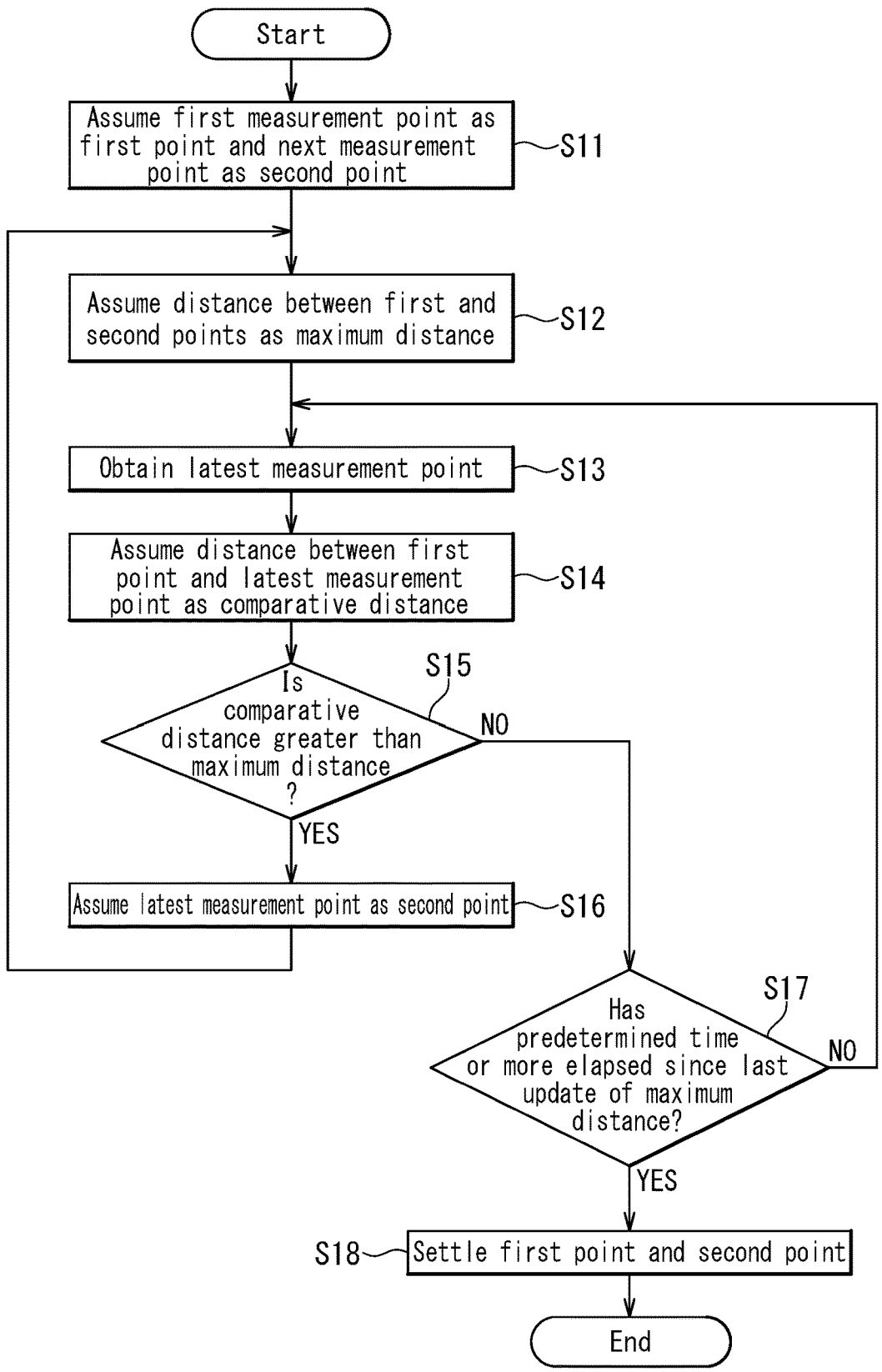
FIG. 13 is a flowchart illustrating a first method of extracting a first point and a second point in the first embodiment of the invention.
Figure 14:
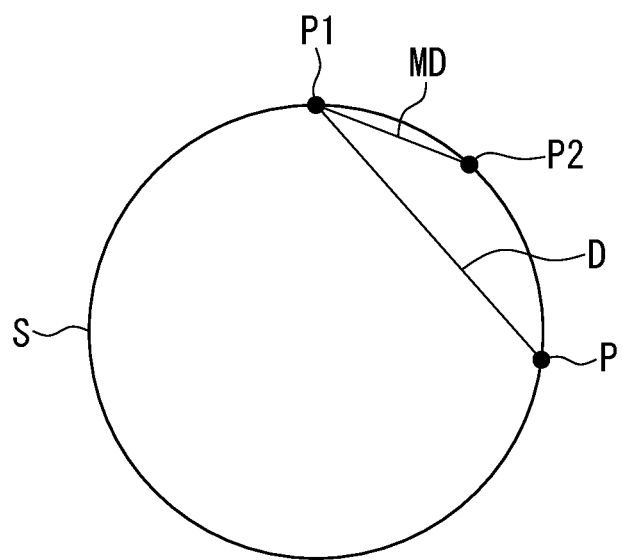
FIG. 14 is an explanatory diagram for describing the first method of extracting the first point and the second point in the first embodiment of the invention.

With reference to FIG. 13 and FIG. 14, the first method will be described first. FIG. 13 is a flowchart illustrating the first method. FIG. 14 is an explanatory diagram for describing the first method. As described above, the plurality of measurement points are distributed over the approximate spherical surface or near the approximate spherical surface. For the sake of convenience, in FIG. 14 the approximate spherical surface is represented by a circle designated by the symbol S.

According to the first method, the first measurement point is assumed as a first point P1 and the next measurement point is assumed as a second point P2 (step S11). Next, the distance between the first and second points P1 and P2 is determined, and the distance is assumed as a maximum distance MD (step S12). Next, the latest measurement point P is obtained (step S13). Then, the distance between the first point P1 and the latest measurement point P is determined, and the distance is assumed as a comparative distance D (step S14).

Next, whether the comparative distance D is greater than the maximum distance MD is determined (step S15). FIG. 14 illustrates a case where the comparative distance D is greater than the maximum distance MD. If the comparative distance D is greater than the maximum distance MD (YES) as illustrated in FIG. 14, the latest measurement point P is assumed as the second point P2 (step S16), and the processing returns to step S12.

If the comparative distance D is smaller than or equal to the maximum distance MD (NO in step S15), then it is determined whether a predetermined time or more has elapsed since the last update of the maximum distance MD (step S17). If the predetermined time or more has elapsed since the last update of the maximum distance MD (YES in step S17), the first point P1 and the second point P2 are settled (step S18). If the predetermined time or more has not elapsed since the last update of the maximum distance MD (NO in step S17), the processing returns to step S13.

If YES in step S17, whether the maximum distance MD is greater than or equal to a predetermined value may be determined. If the maximum distance MD is greater than or equal to the predetermined value, the processing may proceed to step S18. If the maximum distance MD is less than the predetermined value, an error notification may be output to end the processing without settling the first and second points P1 and P2.

In the method illustrated in FIG. 13, the longest segment extraction section 71 determines whether to assume a measurement point P as the second point P2 each time the measurement point P is obtained. However, the longest segment extraction section 71 may initially obtain a predetermined number of measurement points P and then determine, for all the obtained measurement points P one by one, whether to assume the measurement point P as the second point P2.

Figure 15:
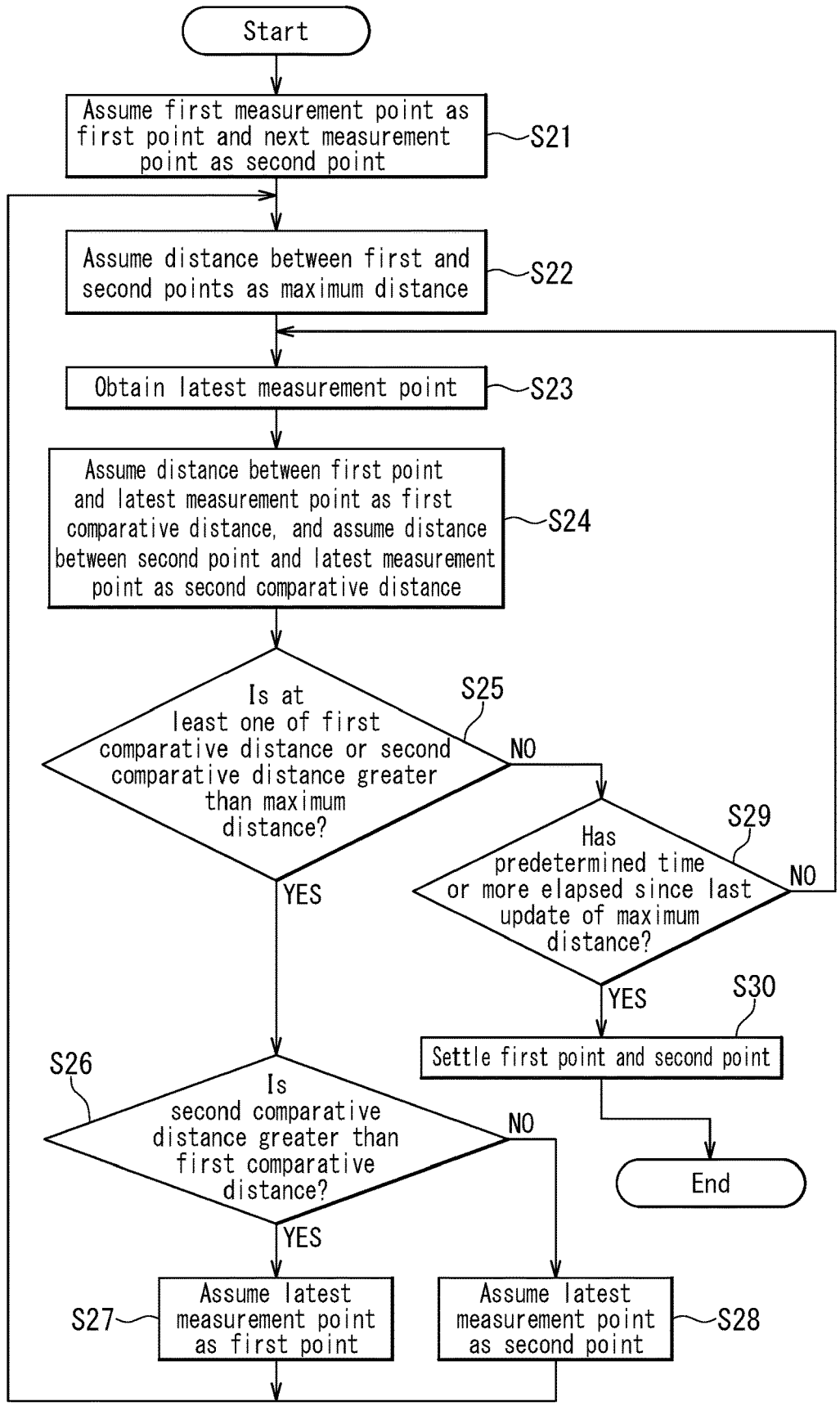
FIG. 15 is a flowchart illustrating a second method of extracting the first point and the second point in the first embodiment of the invention.
Figure 16:
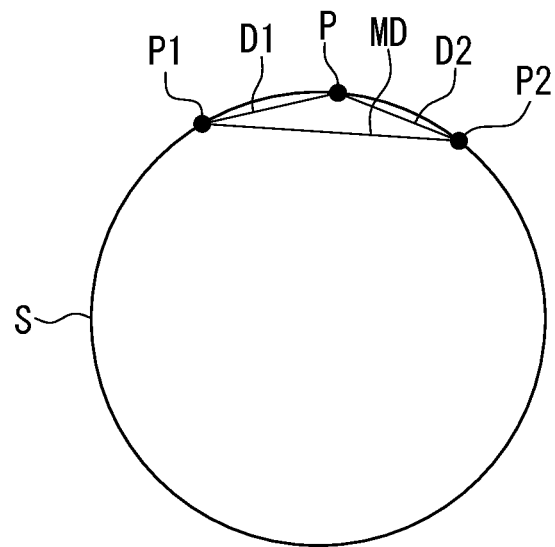
FIG. 16 is an explanatory diagram for describing the second method of extracting the first point and the second point in the first embodiment of the invention.
Figure 17:
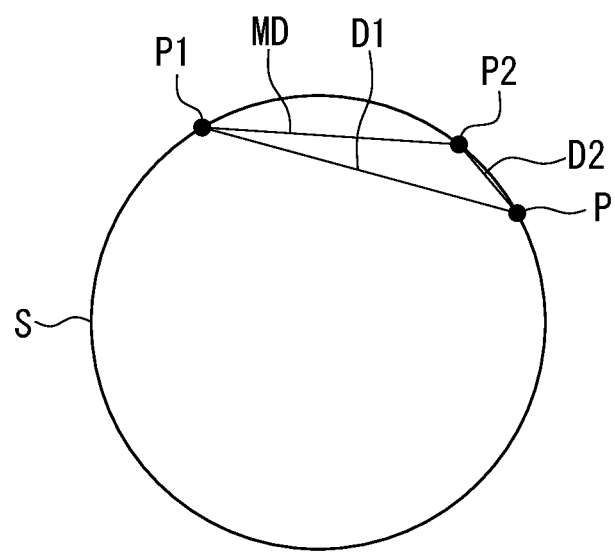
FIG. 17 is an explanatory diagram for describing the second method of extracting the first point and the second point in the first embodiment of the invention.
Figure 18:
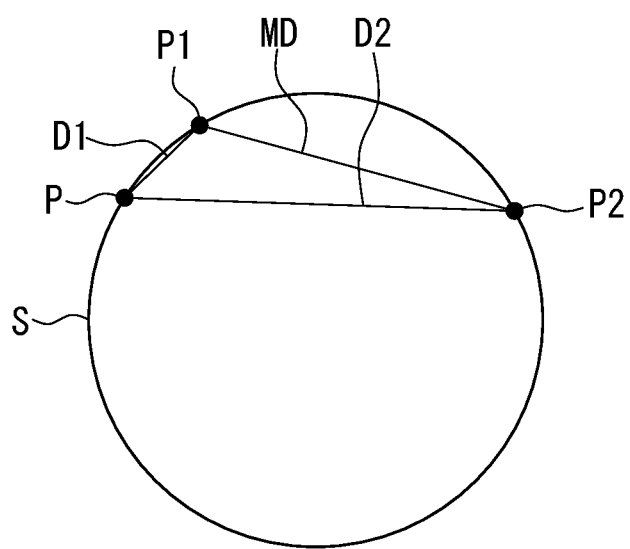
FIG. 18 is an explanatory diagram for describing the second method of extracting the first point and the second point in the first embodiment of the invention.

Next, the second method will be described with reference to FIG. 15 to FIG. 18. FIG. 15 is a flowchart illustrating the second method. FIG. 16 to FIG. 18 are explanatory diagrams for describing the second method. For the sake of convenience, in FIG. 16 to FIG. 18 the approximate spherical surface is represented by a circle designated by the symbol S, as in FIG. 14.

According to the second method, the first measurement point is assumed as a first point P1 and the next measurement point is assumed as a second point P2 (step S21). Next, the distance between the first and second points P1 and P2 is determined, and the distance is assumed as a maximum distance MD (step S22). Next, the latest measurement point P is obtained (step S23). Then, the distance between the first point P1 and the latest measurement point P is determined and the distance is assumed as a first comparative distance D1; and also the distance between the second point P2 and the latest measurement point P is determined and the distance is assumed as a second comparative distance D2 (step S24).

Next, it is determined whether at least one of the first comparative distance D1 or the second comparative distance D2 is greater than the maximum distance MD (step S25). FIG. 16 illustrates a case where both of the first and second comparative distances D1 and D2 are smaller than the maximum distance MD. FIG. 17 illustrates a case where the first comparative distance D1 is greater than the maximum distance MD and the second comparative distance D2. FIG. 18 illustrates a case where the second comparative distance D2 is greater than the maximum distance MD and the first comparative distance D1.

If at least one of the first comparative distance D1 or the second comparative distance D2 is greater than the maximum distance MD (YES in step S25) as illustrated in FIGS. 17 and 18, then it is determined whether the second comparative distance D2 is greater than the first comparative distance D1 (step S26). If the second comparative distance D2 is greater than the first comparative distance D1 (YES in step S26) as illustrated in FIG. 18, then the latest measurement point P is assumed as the first point P1 (step S27) and the processing returns to step S22. If the second comparative distance D2 is less than or equal to the first comparative distance D1 (NO in step S26) as illustrated in FIG. 17, then the latest measurement point P is assumed as the second point P2 (step S28) and the processing returns to step S22.

If both of the first and second comparative distances D1 and D2 are smaller than or equal to the maximum distance MD (NO in step S25) as illustrated in FIG. 16, then it is determined whether a predetermined time or more has elapsed since the last update of the maximum distance MD (step S29). If the predetermined time or more has elapsed since the last update of the maximum distance MD (YES in step S29), the first point P1 and the second point P2 are settled (step S30). If the predetermined time or more has not elapsed since the last update of the maximum distance MD (NO in step S29), the processing returns to step S23.

If YES in step S29, whether the maximum distance MD is greater than or equal to a predetermined value may be determined. If the maximum distance MD is greater than or equal to the predetermined value, the processing may proceed to step S30. If the maximum distance MD is less than the predetermined value, an error notification may be output to end the processing without settling the first and second points P1 and P2.

In the method illustrated in FIG. 15, the longest segment extraction section 71 determines whether to assume a measurement point P as the first point P1 or the second point P2 each time the measurement point P is obtained. However, the longest segment extraction section 71 may initially obtain a predetermined number of measurement points P and then determine, for all the obtained measurement points P one by one, whether to assume the measurement point P as the first point P1 or the second point P2.

Next, the third method will be described. In the third method, three or more candidates for the diameter (any line segment passing through the sphere center and having endpoints on the spherical surface) of the virtual sphere are determined in advance. Then, two measurement points defining a line segment that is the longest and the closest to any one of the three or more candidates for the diameter of the virtual sphere are assumed as the first and second points. Hereinafter, each of two measurement points defining a line segment that is the longest and the closest to each candidate for the diameter at the latest point in time before the first and second points are settled will be referred to as a candidate point, and the two candidate points will collectively be referred to as a candidate point pair.

An example where first to ninth axes are used as the candidates for the diameter of the virtual sphere will be described below. The first to ninth axes are defined as follows using a reference coordinate system where a plurality of measurement points are plotted. In the following description, a is a real number. The first axis is an axis parallel to such a straight line that a point lying on the straight line has coordinates expressed as $(\alpha, 0, 0)$. The second axis is an axis parallel to such a straight line that a point lying on the straight line has coordinates expressed as $(0, \alpha, 0)$. The third axis is an axis parallel to such a straight line that a point lying on the straight line has coordinates expressed as $(0, 0, \alpha)$. The fourth axis is an axis parallel to such a straight line that a point lying on the straight line has coordinates expressed as $(\alpha, \alpha, 0)$. The fifth axis is an axis parallel to such a straight line that a point lying on the straight line has coordinates expressed as $(\alpha, -\alpha, 0)$. The sixth axis is an axis parallel to such a straight line that a point lying on the straight line has coordinates expressed as $(0, \alpha, \alpha)$. The seventh axis is an axis parallel to such a straight line that a point lying on the straight line has coordinates expressed as $(0, \alpha, -\alpha)$. The eighth axis is an axis parallel to such a straight line that a point lying on the straight line has coordinates expressed as $(\alpha, 0, \alpha)$. The ninth axis is an axis parallel to such a straight line that a point lying on the straight line has coordinates expressed as $(-\alpha, 0, \alpha)$.

Two candidate points defining a line segment that is the longest and the closest to the first axis at the latest point in time before the first and second points are settled will be referred to as candidate points P11 and P12. The candidate points P11 and P12 will collectively be referred to as a first candidate point pair. The candidate point P11 is a measurement point where the first detection signal Sx has the greatest value among the plurality of measurement points.

The candidate point P12 is a measurement point where the first detection signal Sx has the smallest value among the plurality of measurement points.

Two candidate points defining a line segment that is the longest and the closest to the second axis at the latest point in time before the first and second points are settled will be referred to as candidate points P21 and P22. The candidate points P21 and P22 will collectively be referred to as a second candidate point pair. The candidate point P21 is a measurement point where the second detection signal Sy has the greatest value among the plurality of measurement points. The candidate point P22 is a measurement point where the second detection signal Sy has the smallest value among the plurality of measurement points.

Two candidate points defining a line segment that is the longest and the closest to the third axis at the latest point in time before the first and second points are settled will be referred to as candidate points P31 and P32. The candidate points P31 and P32 will collectively be referred to as a third candidate point pair. The candidate point P31 is a measurement point where the third detection signal Sz has the greatest value among the plurality of measurement points. The candidate point P32 is a measurement point where the third detection signal Sz has the smallest value among the plurality of measurement points.

Two candidate points defining a line segment that is the longest and the closest to the fourth axis at the latest point in time before the first and second points are settled will be referred to as candidate points P41 and P42. The candidate points P41 and P42 will collectively be referred to as a fourth candidate point pair. The candidate point P41 is a measurement point where the value of Sx+Sy is the greatest among the plurality of measurement points. The candidate point P42 is a measurement point where the value of Sx+Sy is the smallest among the plurality of measurement points.

Two candidate points defining a line segment that is the longest and the closest to the fifth axis at the latest point in time before the first and second points are settled will be referred to as candidate points P51 and P52. The candidate points P51 and P52 will collectively be referred to as a fifth candidate point pair. The candidate point P51 is a measurement point where the value of Sx−Sy is the greatest among the plurality of measurement points. The candidate point P52 is a measurement point where the value of Sx−Sy is the smallest among the plurality of measurement points.

Two candidate points defining a line segment that is the longest and the closest to the sixth axis at the latest point in time before the first and second points are settled will be referred to as candidate points P61 and P62. The candidate points P61 and P62 will collectively be referred to as a sixth candidate point pair. The candidate point P61 is a measurement point where the value of Sy+Sz is the greatest among the plurality of measurement points. The candidate point P62 is a measurement point where the value of Sy+Sz is the smallest among the plurality of measurement points.

Two candidate points defining a line segment that is the longest and the closest to the seventh axis at the latest point in time before the first and second points are settled will be referred to as candidate points P71 and P72. The candidate points P71 and P72 will collectively be referred to as a seventh candidate point pair. The candidate point P71 is a measurement point where the value of Sy−Sz is the greatest among the plurality of measurement points. The candidate point P72 is a measurement point where the value of Sy−Sz is the smallest among the plurality of measurement points.

Two candidate points defining a line segment that is the longest and the closest to the eighth axis at the latest point in time before the first and second points are settled will be referred to as candidate points P81 and P82. The candidate points P81 and P82 will collectively be referred to as an eighth candidate point pair. The candidate point P81 is a measurement point where the value of Sz+Sx is the greatest among the plurality of measurement points. The candidate point P82 is a measurement point where the value of Sz+Sx is the smallest among the plurality of measurement points.

Two candidate points defining a line segment that is the longest and the closest to the ninth axis at the latest point in time before the first and second points are settled will be referred to as candidate points P91 and P92. The candidate points P91 and P92 will collectively be referred to as a ninth candidate point pair. The candidate point P91 is a measurement point where the value of Sz−Sx is the greatest among the plurality of measurement points. The candidate point P92 is a measurement point where the value of Sz−Sx is the smallest among the plurality of measurement points.

Figure 19:
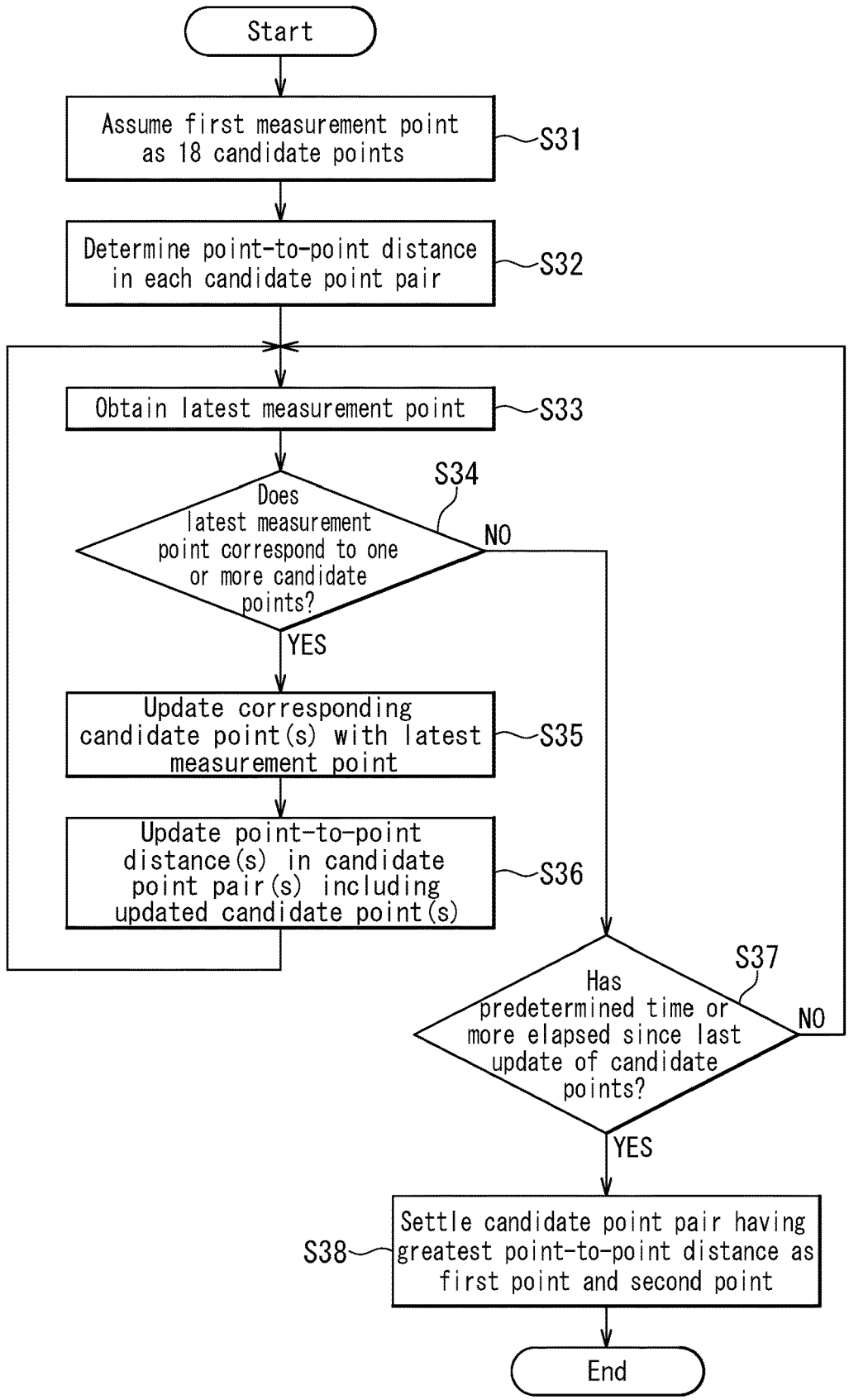
FIG. 19 is a flowchart illustrating a third method of extracting the first point and the second point in the first embodiment of the invention.

The third method will now be described concretely with reference to FIG. 19. By way of example, the following description deals with a case where the first to ninth axes are used as the candidates for the diameter of the virtual sphere. FIG. 19 is a flowchart illustrating the third method.

According to the third method, the first measurement point is initially assumed as 18 candidate points P11, P12, P21, P22, P31, P32, P41, P42, P51, P52, P61, P62, P71, P72, P81, P82, P91 and P92 (step S31). Next, a point-to-point distance, which is the distance between two measurement points, is determined for each of the first to ninth candidate point pairs (step S32). At the point in time when step S32 is executed, the point-to-point distances in all the first to ninth candidate point pairs are 0. The 18 candidate points and the respective point-to-point distances in the first to ninth candidate point pairs are stored by the longest segment extraction section 71 until updated.

Next, the latest measurement point is obtained (step S33). Then, the latest measurement point is compared with the 18 candidate points, and it is determined whether the latest measurement point corresponds to one or more candidate points (step S34). The determination is made by comparing the latest measurement point with the 18 candidate points stored. If the latest measurement point corresponds to one or more candidate points (YES), the corresponding candidate point(s) is/are updated with the latest measurement point (step S35). Next, the point-to-point distance(s) in the candidate point pair(s) including the updated candidate point(s) is/are updated (step S36). The processing then returns to step S33.

If the latest measurement point does not correspond to one or more candidate points (NO in step S34), then it is determined whether a predetermined time or more has elapsed since the last update of the candidate points (step S37). If the predetermined time or more has elapsed since the last update of the candidate points (YES in step S37), then the two candidate points constituting the candidate point pair having the greatest point-to-point distance are settled as the first point P1 and the second point P2 (step S38). If the predetermined time or more has not elapsed since the last update of the candidate points (NO in step S37), the processing returns to step S33.

If YES in step S37, then it may be determined whether the greatest point-to-point distance is greater than or equal to a predetermined value. If the greatest point-to-point distance is greater than or equal to the predetermined value, the processing may proceed to step S38. If the greatest point-to-point distance is less than the predetermined value, an error notification may be output to end the processing without settling the first and second points P1 and P2.

In the method illustrated in FIG. 19, the longest segment extraction section 71 determines whether a measurement point corresponds to one or more candidate points each time the measurement point is obtained. However, the longest segment extraction section 71 may initially obtain a predetermined number of measurement points, then extract 18 candidate points from the predetermined number of measurement points, and settle two candidate points constituting a candidate point pair having the greatest point-to-point distance as the first and second points P1 and P2.

The offset change detection processing by the offset change detection section 73 will now be described concretely. In the offset change detection processing, a determination that the offsets have changed is made in the following manner, for example. First, a set of values of the first to third detection signals Sx, Sy, and Sz at a certain timing is obtained to obtain the foregoing measurement point (Sx, Sy, Sz). The coordinates (mx, my, mz) of the midpoint and the magnetic field strength data M stored in the midpoint coordinate computing section 72 are also obtained. Next, a determination value D is obtained. The determination value D in the present embodiment is a difference between the distance from the measurement point (Sx, Sy, Sz) to the coordinates (mx, my, mz) of the midpoint and the magnetic field strength data M. The determination value D is expressed by the following Eq. (5).

$$D=\sqrt{((Sx-mx)^2+(Sy-my)^2+(Sz-mz)^2)}-M \quad (5)$$

Next, the absolute value of the determination value D is compared with a predetermined threshold. The predetermined threshold is a threshold for detecting a change in the offsets. In the offset change detection processing, if the absolute value of the determination value D is greater than or equal to the predetermined threshold, it is determined that the offsets have changed, and the notification signal Sn is output.

The timing at which the offset change detection section 73 obtains a set of values of the first to third detection signals Sx, Sy, and Sz is synchronized with the sampling period of the first processor 7. The offset change detection section 73 may perform the offset change detection processing each time the offset change detection section 73 obtains a set of values of the first to third detection signals Sx, Sy, and Sz. In such a case, the shorter the sampling period of the first processor 7, the shorter the execution interval of the offset change detection processing.

The offset correction processing by the offset correction section 81 and the position information generation processing by the position information generation section 84 will now be described concretely. In the following description, the first corrected signal, the second corrected signal, and the third corrected signal will be denoted by the symbols CSx, CSy, and CSz, respectively. The center coordinates of the virtual sphere will be expressed as (cx, cy, cz).

As described above, the position of the magnetic field generator 2 in the reference coordinate system changes along the predetermined spherical surface, and the plurality of measurement points are distributed over the approximate spherical surface or near the approximate spherical surface. The center of the predetermined spherical surface coincides or almost coincides with the center of the first spherical surface, i.e., the reference position. Without an offset, the center coordinates (cx, cy, cz) of the virtual sphere having the approximate spherical surface therefore coincide or almost coincide with the reference position. However, if offsets occur, the center coordinates (cx, cy, cz) of the virtual sphere deviate from the reference position.

The point of origin of the reference coordinate system may be the reference position. In such a case, for example, the offset correction processing may be processing for converting a measurement point (Sx, Sy, Sz) into a point (Sx−cx, Sy−cy, Sz−cz) so that the center coordinates (cx, cy, cz) of the virtual sphere computed in the sphere information generation processing become the point of origin (0, 0, 0) of the reference coordinate system. Here, the first to third corrected signals CSx, CSy, and CSz are expressed by the following Eqs. (6) to (8), respectively.

$$CSx=Sx-cx \quad (6)$$

$$CSy=Sy-cy \quad (7)$$

$$CSz=Sz-cz \quad (8)$$

A point (CSx, CSy, CSz) in the reference coordinate system has a correspondence with the coordinates of the magnetic field generator 2 in the reference coordinate system. For example, the position information generation processing may be processing for determining the coordinates of the magnetic field generator 2 in the reference coordinate system by correcting the components of the point (CSx, CSy, CSz), i.e., the first to third corrected signals CSx, CSy, and CSz. The first to third corrected signals CSx, CSy, and CSz are corrected by, for example, multiplying the first to third corrected signals CSx, CSy, and CSz by respective predetermined correction coefficients so that the distance from the point of origin to the point (CSx, CSy, CSz) in the reference coordinate system becomes equal to the actual distance from the magnetic sensor device 4 to the magnetic field generator 2.

Figure 20:
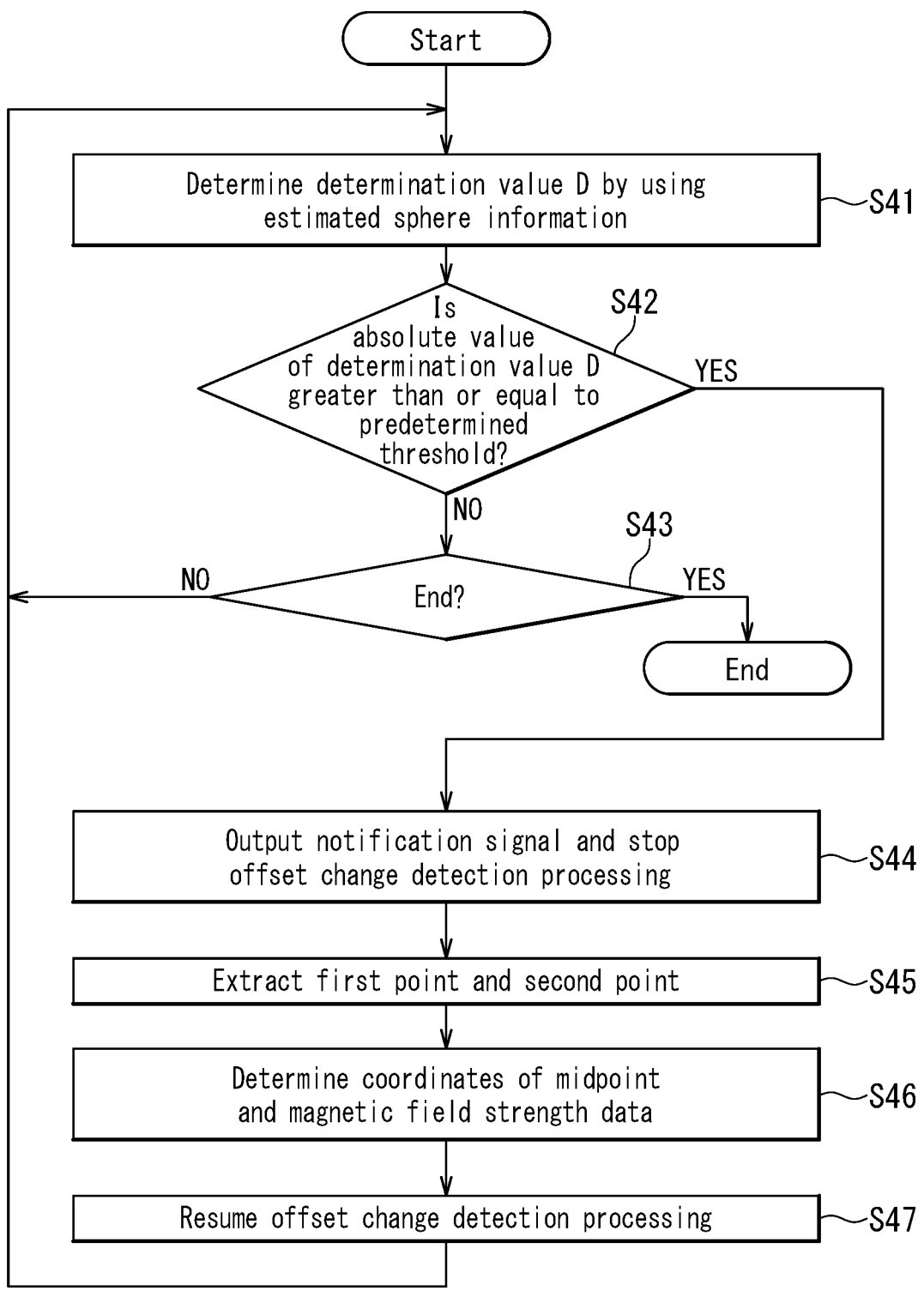
FIG. 20 is a flowchart illustrating the operation of a first processor of the first embodiment of the invention.

Next, an operation of the first processor 7 related to the first processing, the second processing and the offset change detection processing will be described with reference to FIG. 20. FIG. 20 is a flowchart illustrating the operation of the first processor 7. In the operation illustrated in FIG. 20, first, the offset change detection section 73 determines the detection value D by using the estimated sphere information stored by the midpoint coordinate computing section 72 (step S41).

Next, the offset change detection section 73 determines whether the determination value D has an absolute value greater than or equal to a predetermined threshold (step S42). If it is determined in step S42 that the absolute value of the detection value D is not greater than or equal to the predetermined threshold (NO), the first processor 7 determines whether to end the operation illustrated in FIG. 20 (step S43). If it is determined to end the operation (YES) in step S43, the operation illustrated in FIG. 20 is ended. For example, the operation illustrated in FIG. 20 is ended if a signal indicating an end is input to the first processor 7. If it is determined not to end the operation (NO) in step S43, the processing returns to step S41. If it is determined in step S42 that the absolute value of the determination value D is greater than or equal to the predetermined threshold (YES), the offset change detection section 73 outputs the notification signal Sn and stops the offset change detection processing (step S44).

In the operation illustrated in FIG. 20, the longest segment extraction section 71 then performs the first processing to extract the first point and the second point (step S45). Next, the midpoint coordinate computing section 72 performs the second processing to determine the coordinates of the midpoint of the line segment defined by the first and second points and the magnetic field strength data M, and stores the coordinates of the midpoint and the magnetic field strength data M as estimated sphere information (step S46). Next, the offset change detection section 73 resumes the offset change detection processing (step S47), and the processing returns to step S41.

Figure 21:
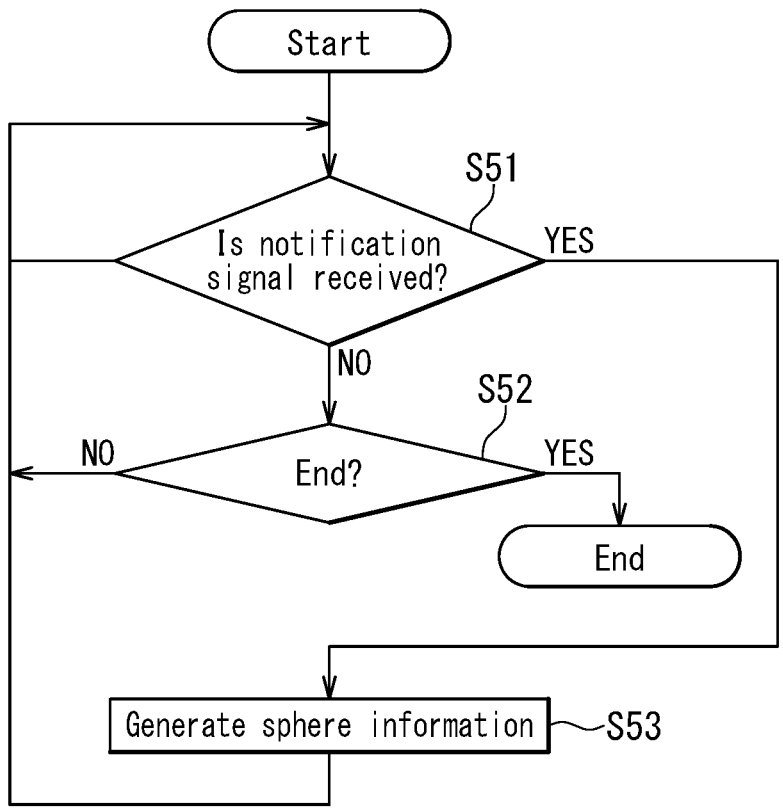
FIG. 21 is a flowchart illustrating the operation of a second processor of the first embodiment of the invention.

Next, an operation of the second processor 8 related to the generation of the sphere information Ss will be described with reference to FIG. 21. FIG. 21 is a flowchart illustrating the operation of the second processor 8 related to the generation of the sphere information Ss. In the operation illustrated in FIG. 21, first, the sphere information generation section 82 checks whether the notification signal Sn is received (step S51). If it is confirmed in step S51 that the notification signal Sn is not received (NO), the second processor 8 determines whether to end the operation illustrated in FIG. 21 (step S52). If it is determined to end the operation (YES) in step S52, the operation illustrated in FIG. 21 is ended. For example, the operation illustrated in FIG. 21 is ended if a signal indicating an end is input to the second processor 8. If it is determined not to end the operation (NO) in step S52, step S51 is executed again after a lapse of a predetermined time.

If it is confirmed in step S51 that the notification signal Sn is received (YES), the sphere information generation section 82 generates sphere information Ss (step S53). In the operation illustrated in FIG. 21, the processing returns to step S51 after the execution of step S53.

As has been described, the signal processing circuit 5, the position detection device 1, and the magnetic sensor system 3 according to the present embodiment perform the first processing for extracting a first point and a second point that define a line segment having the greatest length among a plurality of measurement points at a plurality of timings, and the second processing for determining the coordinates of a midpoint of the line segment defined by the first and second points extracted by the first processing. The coordinates of the midpoint of the line segment defined by the first and second points correspond to estimated center coordinates of the virtual sphere.

One of methods for computing the center coordinates of the virtual sphere is to generate the sphere information Ss by the sphere information generation processing. As described above, to determine the center coordinates and radius of the virtual sphere as the sphere information Ss, it is necessary to determine an approximate spherical surface by using the equation of the spherical surface, for example. The processing for generating the sphere information Ss thus needs relatively complicated computations and a considerable amount of time.

In contrast, the first processing for extracting the first and second points and the second processing for determining the coordinates of the midpoint of the line segment defined by the first and second points can be performed by using simpler computations than those used for the processing for generating the sphere information Ss. According to the present embodiment, the center coordinates of the virtual sphere after a change in the offsets can therefore be quickly estimated by performing the relatively simple first and second processing after the change in the offsets of the first to third detection signals Sx, Sy, and Sz is detected by the offset change detection processing.

In the present embodiment, further, the second processing includes determining the magnetic field strength data M and storing the coordinates of the midpoint and the magnetic field strength data M as estimated sphere information. The offset change detection processing is performed by using the estimated sphere information stored by the second processing. According to the present embodiment, in the case where the offset change detection processing is stopped after a change in the offsets of the first to third detection signals Sx, Sy, and Sz is detected, it is possible to quickly resume the offset change detection processing by performing the relatively simple first and second processing.

Second Embodiment

Figure 22:
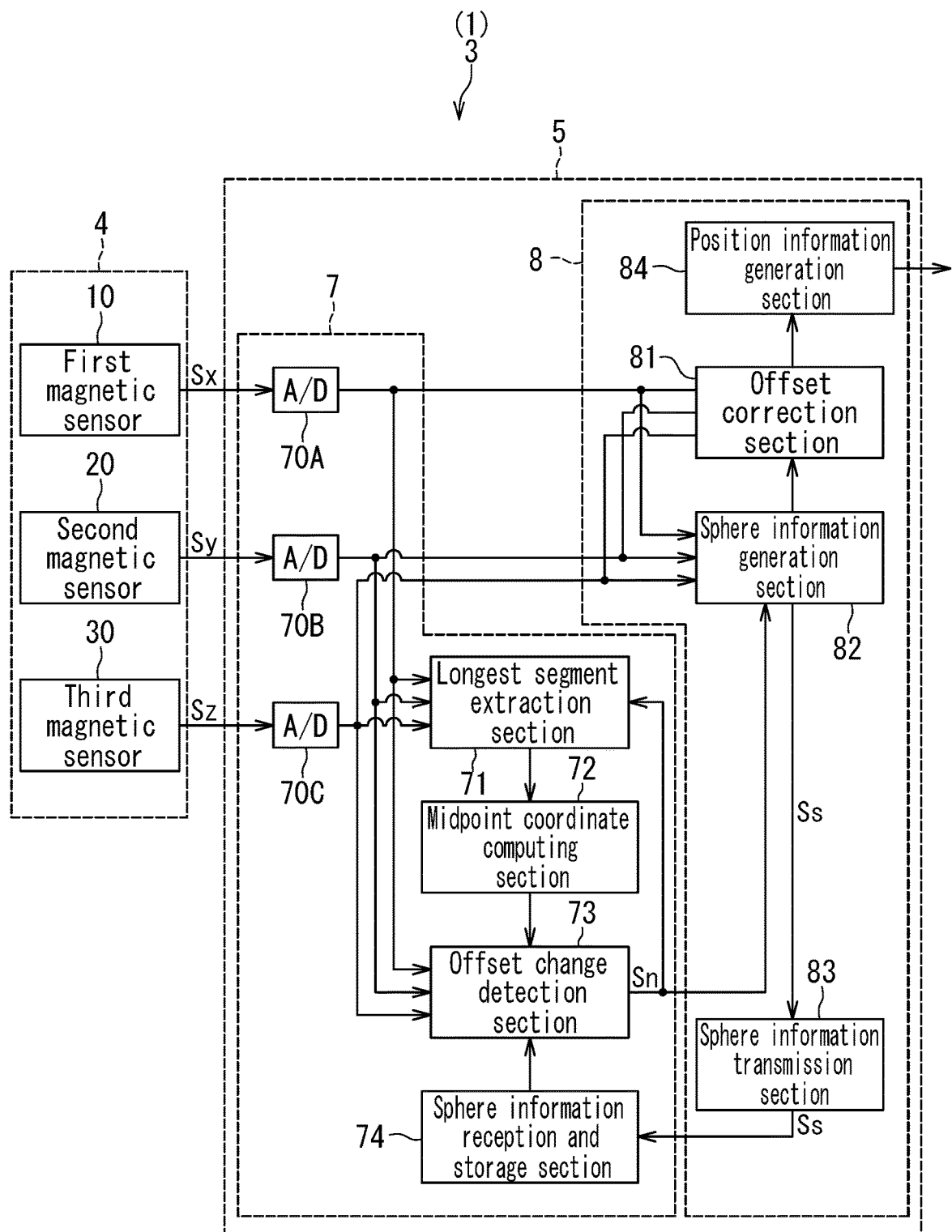
FIG. 22 is a functional block diagram illustrating a configuration of a magnetic sensor system according to a second embodiment of the invention.

A second embodiment of the invention will now be described. First, with reference to FIG. 22, a description will be given of differences of the signal processing circuit 5 according to the second embodiment from that according to the first embodiment. FIG. 22 is a functional block diagram illustrating a configuration of the magnetic sensor system 3 according to the present embodiment.

The signal processing circuit 5 according to the present embodiment performs sphere information reception and storage processing and sphere information transmission processing, in addition to the first processing, the second processing, the offset change detection processing, the sphere information generation processing, the offset correction processing and the position information generation processing described in relation to the first embodiment. The first processor 7 of the signal processing circuit 5 includes a sphere information reception and storage section 74 for performing the sphere information reception and storage processing, in addition to the longest segment extraction section 71, the midpoint coordinate computing section 72 and the offset change detection section 73 described in relation to the first embodiment. The second processor 8 of the signal processing circuit 5 includes a sphere information transmission section 83 for performing the sphere information transmission processing, in addition to offset correction section 81, the sphere information generation section 82 and the position information generation section 84 described in relation to the first embodiment.

The sphere information reception and storage section 74 and the sphere information transmission section 83 are functional blocks for performing the respective processing described above. The sphere information reception and storage processing and the sphere information transmission processing are each repeated during use of the position detection device 1.

The sphere information transmission processing by the sphere information transmission section 83 includes transmitting the sphere information Ss generated by the sphere information generation processing to the sphere information reception and storage section 74 after the execution of the sphere information generation processing by the sphere information generation section 82. The sphere information reception and storage processing by the sphere information reception and storage section 74 includes receiving and storing the sphere information Ss transmitted from the sphere information transmission section 83.

In the present embodiment, the offset change detection processing by the offset change detection section 73 is performed by using either the estimated sphere information, which is a set of the coordinates of the midpoint and the magnetic field strength data M stored by the second processing of the midpoint coordinate computing section 72, or the sphere information Ss stored by the sphere information reception and storage processing of the sphere information reception and storage section 74, i.e., the sphere information Ss generated by the sphere information generation processing.

As has been described in relation to the first embodiment, the sphere information generation section 82 is configured to be capable of receiving the notification signal Sn, and is configured to start the sphere information generation processing if the notification signal Sn is received. The offset change detection processing by the offset change detection section 73 includes, upon detection of a change in the offsets, outputting the notification signal Sn to the sphere information generation section 82 to allow the sphere information generation processing to get started. The sphere information generation processing by the sphere information generation section 82 includes starting to generate latest sphere information Ss upon reception of the notification signal Sn. The sphere information reception and storage processing by the sphere information reception and storage section 74 includes updating the stored sphere information Ss upon reception of new sphere information Ss.

If the initial sphere information described in relation to the first embodiment is stored in the sphere information generation section 82, the first and second processors 7 and 8 may perform initial processing as described below before the sphere information generation processing is executed for the first time after the position detection device 1 starts to be used. In the initial processing, the sphere information transmission section 83 transmits the initial sphere information to the sphere information reception and storage section 74. The sphere information reception and storage section 74 receives and stores the initial sphere information. Before the sphere information generation processing is executed for the first time, the offset change detection section 73 may detect a change in the offsets by using the estimated sphere information, by using the initial estimated sphere information described in the first embodiment, or by using the initial sphere information.

The offset change detection processing by the offset change detection section 73 will now be described concretely. According to the offset change detection processing, in both a first case where the estimated sphere information is used and a second case where the sphere information Ss is used, a determination value D is determined and the absolute value of the determination value D is compared with a predetermined threshold, like the offset change detection processing in the first embodiment. If the absolute value of the determination value D is greater than or equal to the predetermined threshold, it is determined that the offsets have changed, and the notification signal Sn is output. The method for computing the determination value D in the first case is the same as in the first embodiment. Specifically, the determination value D in the first case is expressed by the foregoing Eq. (5).

The determination value D in the second case is determined in the following manner. First, a set of values of the first to third detection signals Sx, Sy, and Sz at a certain timing is obtained to obtain the measurement point (Sx, Sy, Sz). The sphere information Ss stored in the sphere information reception and storage section 74 is also obtained. Next, obtained are a distance between the measurement point (Sx, Sy, Sz) and the center coordinates (cx, cy, cz) of the virtual sphere included in the sphere information Ss, and a difference between the distance and the radius r of the virtual sphere included in the sphere information Ss. The difference is the determination value D in the second case. The determination value D in the second case is expressed by the following Eq. (9).

$$D=\sqrt{((Sx-cx)^2+(Sy-cy)^2+(Sz-cz)^2)}-r \quad (9)$$

Figure 23:
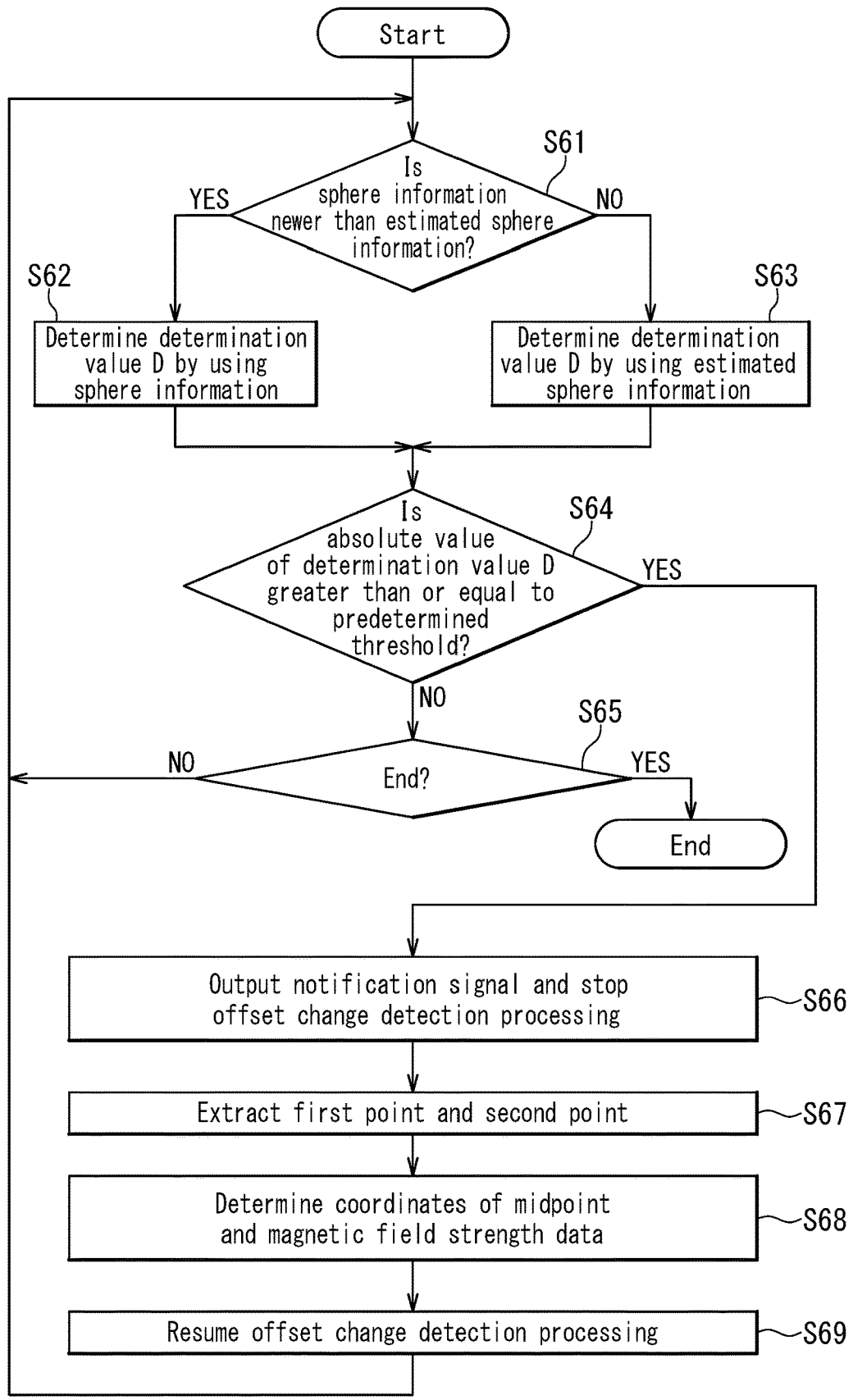
FIG. 23 is a flowchart illustrating the operation of the first processor of the second embodiment of the invention.

Next, an operation of the first processor 7 related to the first processing, the second processing, the offset change detection processing, and the sphere information reception and storage processing will be described with reference to FIG. 23. FIG. 23 is a flowchart illustrating the operation of the first processor 7.

In the operation illustrated in FIG. 23, first, the offset change detection section 73 checks whether the sphere information Ss stored in the sphere information reception and storage section 74 is newer than the estimated sphere information stored in the midpoint coordinate computing section 72 (step S61). If the sphere information Ss is newer (YES), the offset change detection section 73 determines the determination value D by Eq. (9) using the sphere information Ss (step S62). If the sphere information Ss is not newer (NO), the offset change detection section 73 determines the determination value D by Eq. (5) using the estimated sphere information (step S63).

Before the sphere information generation processing is executed for the first time, step S63 is performed since there is no sphere information Ss stored in the sphere information reception and storage section 74. If the initial estimated sphere information is stored in the midpoint coordinate computing section 72, the offset change detection section 73 may perform processing for determining the determination value D by using the initial estimated sphere information instead of step S63 before the sphere information generation processing is executed for the first time. In such a case, the determination value D can be determined by replacing the coordinates of the midpoint and the magnetic field strength data M in Eq. (5) with the initial values of the coordinates of the midpoint and the initial value of the magnetic field strength data M, respectively. Alternatively, if the initial sphere information is stored in the sphere information reception and storage section 74, the offset change detection section 73 may perform processing for determining the determination value D by using the initial sphere information instead of step S63 before the sphere information generation processing is executed for the first time. In such a case, the determination value D can be determined by replacing the center coordinates and radius r of the virtual sphere in Eq. (9) with the initial values of the center coordinates and the initial value of the radius r of the virtual sphere, respectively.

In the operation illustrated in FIG. 23, the offset change detection section 73 determines whether the absolute value of the determination value D is greater than or equal to a predetermined threshold (step S64) after the execution of step S62 or step S63. If it is determined in step S64 that the absolute value of the detection value D is not greater than or equal to the predetermined threshold (NO), the first processor 7 determines whether to end the operation illustrated in FIG. 23 (step S65). If it is determined to end the operation (YES) in step S65, the operation illustrated in FIG. 23 is ended. For example, the operation illustrated in FIG. 23 is ended if a signal indicating an end is input to the first processor 7. If it is determined not to end the operation (NO) in step S65, the processing returns to step S61. If it is determined in step S64 that the absolute value of the determination value D is greater than or equal to the predetermined threshold (YES), the offset change detection section 73 outputs the notification signal Sn and stops the offset change detection processing (step S66).

In the operation illustrated in FIG. 23, the longest segment extraction section 71 then performs the first processing to extract the first point and the second point (step S67). Next, the midpoint coordinate computing section 72 performs the second processing to determine the coordinates of the midpoint of the line segment defined by the first and second points and the magnetic field strength data M, and stores the coordinates of the midpoint and the magnetic field strength data M as estimated sphere information (step S68). Next, the offset change detection section 73 resumes the offset change detection processing (step S69), and the processing returns to step S61.

Figure 24:
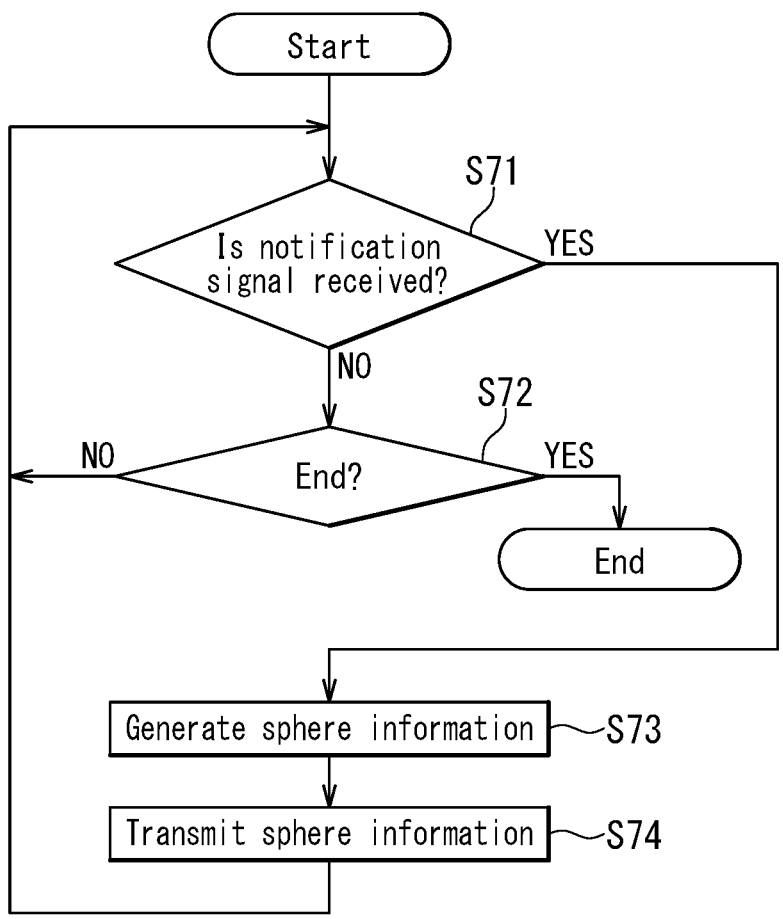
FIG. 24 is a flowchart illustrating the operation of the second processor of the second embodiment of the invention.

Next, an operation of the second processor 8 related to the generation and transmission of the sphere information Ss will be described with reference to FIG. 24. FIG. 24 is a flowchart illustrating the operation of the second processor 8 related to the generation and transmission of the sphere information Ss. In the operation illustrated in FIG. 24, first, the sphere information generation section 82 checks whether the notification signal Sn is received (step S71). If it is confirmed in step S71 that the notification signal Sn is not received (NO), the second processor 8 determines whether to end the operation illustrated in FIG. 24 (step S72). If it is determined to end the operation (YES) in step S72, the operation illustrated in FIG. 24 is ended. For example, the operation illustrated in FIG. 24 is ended if a signal indicating an end is input to the second processor 8. If it is determined not to end the operation (NO) in step S72, step S71 is executed again after a lapse of a predetermined time.

If it is confirmed in step S71 that the notification signal Sn is received (YES), the sphere information generation section 82 generates sphere information Ss (step S73). Next, the sphere information transmission section 83 transmits the sphere information Ss to the sphere information reception and storage section 74 (step S74). In the operation illustrated in FIG. 24, the processing returns to step S71 after the execution of step S74.

As described above, in the present embodiment, the offset change detection processing is performed by using either the estimated sphere information, i.e., the set of the coordinates of the midpoint and the magnetic field strength data M stored by the second processing or the sphere information Ss generated by the sphere information generation processing. The coordinates of the midpoint correspond to estimated center coordinates of the virtual sphere. The magnetic field strength data M corresponds to the data on the estimated radius of the virtual sphere. If the estimated sphere information is used, the offset change detection processing can be quickly resumed as in the first embodiment.

In contrast, the sphere information Ss generated by the sphere information generation processing is not the estimated values of the center coordinates and radius of the virtual sphere like the coordinates of the midpoint and the magnetic field strength data M, but the center coordinates and radius of the virtual sphere themselves. According to the present embodiment, it is thus possible to accurately detect a change in the offsets of the first to third detection signals Sx, Sy, and Sz by performing the offset change detection processing using the sphere information Ss generated by the sphere information generation processing.

In the present embodiment, if new sphere information Ss is obtained within a predetermined time after the start of the sphere information generation processing, the offset change detection processing is performed by using the new sphere information Ss. If no new sphere information Ss is obtained within the predetermined time after the start of the sphere information generation processing, the offset change detection processing is performed by using the estimated sphere information. According to the present embodiment, it is thus possible to quickly resume the offset change detection processing. The present embodiment also makes it possible to resume the offset change detection processing even if the sphere information reception and storage section 74 fails to receive the sphere information Ss transmitted from the sphere information transmission section 83.

The configuration, function and effects of the present embodiment are otherwise the same as those of the first embodiment.

The present invention is not limited to the foregoing embodiments, and various modifications may be made thereto. For example, the longest segment extraction section 71, the midpoint coordinate computing section 72, the offset change detection section 73 and the sphere information reception and storage section 74 may be provided in the second processor 8.

Further, the signal processing circuit and the magnetic sensor system of the present invention are applicable not only to detection of the relative position of the magnetic field generator with respect to the magnetic sensor device but also to detection of the orientation of the magnetic sensor device configured to be rotatable in a predetermined magnetic field.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A signal processing circuit for processing a first detection signal, a second detection signal, and a third detection signal that have correspondences with components in three mutually different directions of a magnetic field at a reference position, the first to third detection signals being output from a magnetic sensor device that generates the first to third detection signals, the signal processing circuit performing first processing and second processing, the first processing including, with coordinates that represent a set of values of the first to third detection signals at a certain timing in an orthogonal coordinate system defined by three axes for expressing the values of the first to third detection signals being taken as a measurement point, extracting a first point and a second point that define a line segment having the greatest length among a plurality of measurement points at a plurality of timings, the second processing including determining coordinates of a midpoint of the line segment defined by the first and second points extracted by the first processing, the second processing further including determining one half of the length of the line segment defined by the first and second points as magnetic field strength data, and storing the coordinates of the midpoint and the magnetic field strength data, the signal processing circuit further performing offset change detection processing for detecting a change in offsets of the first to third detection signals by using the coordinates of the midpoint and the magnetic field strength data stored by the second processing.

2. The signal processing circuit according to claim 1, further performing sphere information generation processing for generating sphere information by computation using the first to third detection signals, the sphere information including data on center coordinates and a radius of a virtual sphere having a spherical surface approximating a distribution of the plurality of measurement points at the plurality of timings.

3. A position detection device comprising:
a magnetic field generator that generates a predetermined magnetic field;
a magnetic sensor device; and
the signal processing circuit of claim 1, wherein
the magnetic field generator is able to change its relative position with respect to the magnetic sensor device along a predetermined spherical surface, and
the magnetic sensor device generates the first to third detection signals.

4. A magnetic sensor system comprising:
a magnetic sensor device; and
the signal processing circuit of claim 1,
wherein the magnetic sensor device includes a first magnetic sensor for generating the first detection signal, a second magnetic sensor for generating the second detection signal, and a third magnetic sensor for generating the third detection signal.

5. A signal processing circuit for processing a first detection signal, a second detection signal, and a third detection signal that have correspondences with components in three mutually different directions of a magnetic field at a reference position, the first to third detection signals being output from a magnetic sensor device that generates the first to third detection signals,
the signal processing circuit performing first processing and second processing,
the first processing including, with coordinates that represent a set of values of the first to third detection signals at a certain timing in an orthogonal coordinate system defined by three axes for expressing the values of the first to third detection signals being taken as a measurement point, extracting a first point and a second point that define a line segment having the greatest length among a plurality of measurement points at a plurality of timings,
the second processing including determining coordinates of a midpoint of the line segment defined by the first and second points extracted by the first processing,
the signal processing circuit further performing:
sphere information generation processing for generating sphere information by computation using the first to third detection signals, the sphere information including data on center coordinates and a radius of a virtual sphere having a spherical surface approximating a distribution of the plurality of measurement points at the plurality of timings; and
offset correction processing, the offset correction processing including correcting offsets of the first to third detection signals to generate first to third corrected signals by using the data on the center coordinates included in the sphere information generated by the sphere information generation processing.

6. A signal processing circuit for processing a first detection signal, a second detection signal, and a third detection signal that have correspondences with components in three mutually different directions of a magnetic field at a reference position, the first to third detection signals being output from a magnetic sensor device that generates the first to third detection signals,
the signal processing circuit performing first processing and second processing,
the first processing including, with coordinates that represent a set of values of the first to third detection signals at a certain timing in an orthogonal coordinate system defined by three axes for expressing the values of the first to third detection signals being taken as a measurement point, extracting a first point and a second point that define a line segment having the greatest length among a plurality of measurement points at a plurality of timings,
the second processing including determining coordinates of a midpoint of the line segment defined by the first and second points extracted by the first processing,
the signal processing circuit further performing:
sphere information generation processing for generating sphere information by computation using the first to third detection signals, the sphere information including data on center coordinates and a radius of a virtual sphere having a spherical surface approximating a distribution of the plurality of measurement points at the plurality of timings; and
offset change detection processing for detecting a change in offsets of the first to third detection signals, the offset change detection processing including starting the sphere information generation processing upon detection of a change in the offsets.

7. The signal processing circuit according to claim 6, wherein
the second processing further includes determining one half of the length of the line segment defined by the first and second points as magnetic field strength data, and storing the coordinates of the midpoint and the magnetic field strength data, and
the offset change detection processing is performed by using either a set of the coordinates of the midpoint and the magnetic field strength data stored by the second processing or the sphere information generated by the sphere information generation processing.

8. The signal processing circuit according to claim 7, wherein, if new sphere information is obtained within a predetermined time after the sphere information generation processing is started, the offset change detection processing is performed by using the new sphere information, and if no new sphere information is obtained within the predetermined time after the sphere information generation processing is started, the offset change detection processing is performed by using the set of the coordinates of the midpoint and the magnetic field strength data.

9. A signal processing circuit for processing a first detection signal, a second detection signal, and a third detection signal that have correspondences with components in three mutually different directions of a magnetic field at a reference position, the first to third detection signals being output from a magnetic sensor device that generates the first to third detection signals,
the signal processing circuit performing first processing and second processing,
the first processing including, with coordinates that represent a set of values of the first to third detection signals at a certain timing in an orthogonal coordinate system defined by three axes for expressing the values of the first to third detection signals being taken as a measurement point, extracting a first point and a second point that define a line segment having the greatest length among a plurality of measurement points at a plurality of timings,
the second processing including determining coordinates of a midpoint of the line segment defined by the first and second points extracted by the first processing, the first processing further including:
- a first subprocessing of assuming a first measurement point as a first hypothetical point and assuming a next measurement point as a second hypothetical point;
- a second subprocessing of, after executing the first subprocessing, determining a distance between the first hypothetical point and the second hypothetical point and assuming the distance as a maximum distance;
- a third subprocessing of, after executing the second subprocessing, obtaining a latest measurement point as a measurement point for determination;
- a fourth subprocessing of, after executing the third subprocessing, determining whether to assume the measurement point for determination as the first hypothetical point or the second hypothetical point; and
- a fifth subprocessing of determining whether a predetermined time or more has elapsed since a last update of the maximum distance, the signal processing circuit being configured to:
- if the fourth subprocessing determines to assume the measurement point for determination as the first hypothetical point or the second hypothetical point, execute the second subprocessing again;
- if the fourth subprocessing determines not to assume the measurement point for determination as the first hypothetical point or the second hypothetical point, execute the fifth subprocessing;
- if the fifth subprocessing determines that the predetermined time or more has elapsed since the last update of the maximum distance, settle the first hypothetical point and the second hypothetical point as the first point and the second point; and
- if the fifth subprocessing determines that the predetermined time or more has not elapsed since the last update of the maximum distance, execute the third subprocessing again.

10. The signal processing circuit according to claim 9, wherein
the fourth subprocessing includes:
- determining a distance between the first hypothetical point and the measurement point for determination and assuming the distance as a comparative distance; and
- determining whether the comparative distance is greater than the maximum distance, and
- if the fourth subprocessing determines that the comparative distance is greater than the maximum distance, the signal processing circuit assumes the measurement point for determination as the second hypothetical point.

11. The signal processing circuit according to claim 9, wherein
the fourth subprocessing includes:
- determining a distance between the first hypothetical point and the measurement point for determination and assuming the distance as a first comparative distance;
- determining a distance between the second hypothetical point and the measurement point for determination and assuming the distance as a second comparative distance; and
- determining whether at least one of the first comparative distance or the second comparative distance is greater than the maximum distance, and
- if the fourth subprocessing determines that the second comparative distance is greater than the first comparative distance, then the signal processing circuit assumes the measurement point for determination as the first hypothetical point, and if the fourth subprocessing determines that the second comparative distance is less than or equal to the first comparative distance, then the signal processing circuit assumes the measurement point for determination as the second hypothetical point.

12. A signal processing circuit for processing a first detection signal, a second detection signal, and a third detection signal that have correspondences with components in three mutually different directions of a magnetic field at a reference position, the first to third detection signals being output from a magnetic sensor device that generates the first to third detection signals,
the signal processing circuit performing first processing and second processing,
the first processing including, with coordinates that represent a set of values of the first to third detection signals at a certain timing in an orthogonal coordinate system defined by three axes for expressing the values of the first to third detection signals being taken as a measurement point, extracting a first point and a second point that define a line segment having the greatest length among a plurality of measurement points at a plurality of timings,
the second processing including determining coordinates of a midpoint of the line segment defined by the first and second points extracted by the first processing,
the first and second points being two measurement points defining a line segment that is longest and closest to any one of three or more candidates for a diameter of a virtual sphere having a spherical surface approximating a distribution of the plurality of measurement points,
each of two measurement points defining a line segment that is longest and closest to each of the three or more candidates for the diameter at a latest point in time before the first and second points are settled is assumed as a candidate point, and two candidate points are assumed a candidate point pair, the candidate point pair comprising a plurality of candidate point pairs,
the first processing further including:
- a first subprocessing of assuming a first measurement point as all candidate points of three or more of the candidate point pairs;
- a second subprocessing of, after executing the first subprocessing, determining a point-to-point distance for each of the candidate point pairs, the point-to-point distance being a distance between the two measurement points;
- a third subprocessing of, after executing the second subprocessing, obtaining a latest measurement point as a measurement point for determination;
- a fourth subprocessing of, after executing the third subprocessing, comparing the measurement point for determination with the all candidate points and determining whether the measurement point for determination corresponds to one or more of the candidate points; and
- a fifth subprocessing of determining whether a predetermined time or more has elapsed since a last update of the candidate points, the signal processing circuit being configured to:
- if the fourth subprocessing determines that the measurement point for determination corresponds to the one or more of the candidate points, update the corresponding candidate points with the measurement point for determination, update the point-to-point distance in the candidate point pair including the updated candidate point, and then execute the third subprocessing again;

if the fourth subprocessing determines that the measurement point for determination does not correspond to the one or more of the candidate points, execute the fifth subprocessing;

if the fifth subprocessing determines that the predetermined time or more has elapsed since the last update of the candidate points, settle the two candidate points constituting the candidate point pair having a greatest point-to-point distance as the first point and the second point; and if the fifth subprocessing determines that the predetermined time or more has not elapsed since the last update of the candidate points, execute the third subprocessing again.

* * * * *